United States Patent
Hata et al.

(10) Patent No.: US 7,817,694 B2
(45) Date of Patent: Oct. 19, 2010

(54) SEMICONDUCTOR LASER APPARATUS AND MANUFACTURING METHOD THEREOF

(75) Inventors: Masayuki Hata, Kadoma (JP); Yasuyuki Bessho, Uji (JP); Yasuhiko Nomura, Moriguchi (JP); Masayuki Shono, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 272 days.

(21) Appl. No.: 11/215,066

(22) Filed: Aug. 31, 2005

(65) Prior Publication Data

US 2006/0045156 A1    Mar. 2, 2006

(30) Foreign Application Priority Data

Aug. 31, 2004    (JP) .............................. 2004-253048

(51) Int. Cl.
    *H01S 5/00* (2006.01)
(52) U.S. Cl. .................... 372/50.12; 372/36; 372/43.01
(58) Field of Classification Search .............. 372/43.01, 372/36, 50.12
    See application file for complete search history.

(56) References Cited

U.S. PATENT DOCUMENTS

| | | | |
|---|---|---|---|
| 4,916,710 A | | 4/1990 | Hattori |
| 5,228,050 A | * | 7/1993 | LaCourse et al. ....... 372/50.121 |
| 5,402,436 A | * | 3/1995 | Paoli ........................ 372/50.12 |
| 5,638,391 A | * | 6/1997 | Shima et al. ............ 372/44.011 |
| 6,136,623 A | | 10/2000 | Hofstetter et al. |
| 6,643,310 B2 | * | 11/2003 | Nemoto ...................... 372/50.1 |
| 2001/0048703 A1 | * | 12/2001 | Oh ............................... 372/43 |
| 2001/0050531 A1 | | 12/2001 | Ikeda |
| 2001/0050933 A1 | | 12/2001 | Takahashi et al. |
| 2003/0052945 A1 | * | 3/2003 | Baleras et al. ................ 347/53 |
| 2003/0198270 A1 | | 10/2003 | Nemoto |
| 2003/0214616 A1 | * | 11/2003 | Komoto et al. ................ 349/96 |

(Continued)

FOREIGN PATENT DOCUMENTS

JP    11-112091 A    4/1999

(Continued)

OTHER PUBLICATIONS

United States Office Action issued in U.S. Appl. No. 11/215,066, mailed Dec. 18, 2007.

(Continued)

*Primary Examiner*—Minsun Harvey
*Assistant Examiner*—Joshua King
(74) *Attorney, Agent, or Firm*—McDermott Will & Emery LLP

(57) ABSTRACT

A one-chip semiconductor laser device for use in a semiconductor laser apparatus has a structure in which a red semiconductor laser device and an infrared semiconductor laser device are stacked on a blue-violet semiconductor laser device. The blue-violet semiconductor laser device is manufactured by forming semiconductor layers on a GaN substrate. Each of the red semiconductor laser device and the infrared semiconductor laser device is manufactured by forming semiconductor layers on a GaAs substrate. The modulus of elasticity of GaAs is smaller than the modulus of elasticity of GaN. The length of each of the red semiconductor laser device and the infrared semiconductor laser device is longer than the length of the blue-violet semiconductor laser device.

20 Claims, 21 Drawing Sheets

U.S. PATENT DOCUMENTS

| | | | |
|---|---|---|---|
| 2004/0109481 A1* | 6/2004 | Ikeda | 372/36 |
| 2004/0136428 A1 | 7/2004 | Miyachi et al. | |
| 2004/0184502 A1* | 9/2004 | Miyachi et al. | 372/50 |
| 2004/0245534 A1 | 12/2004 | Yamada | |
| 2005/0082550 A1* | 4/2005 | Hamaoka et al. | 257/80 |
| 2005/0175052 A1 | 8/2005 | Nemoto | |
| 2005/0180480 A1 | 8/2005 | Nemoto | |
| 2005/0218420 A1 | 10/2005 | Bessho et al. | |
| 2005/0220159 A1 | 10/2005 | Bessho et al. | |
| 2005/0232321 A1 | 10/2005 | Inoue et al. | |
| 2005/0232322 A1 | 10/2005 | Bessho et al. | |
| 2005/0242361 A1 | 11/2005 | Bessho et al. | |

FOREIGN PATENT DOCUMENTS

| | | |
|---|---|---|
| JP | 11-340587 | 12/1999 |
| JP | 2001-044560 | 2/2001 |
| JP | 2001-229570 A | 8/2001 |
| JP | 2001-230502 | 8/2001 |
| JP | 2001-244570 | 9/2001 |
| JP | 2002-118331 A | 4/2002 |
| JP | 2002-232077 | 8/2002 |
| JP | 2002-232077 A | 8/2002 |
| JP | 2003-298193 | 10/2003 |
| JP | 2004-119580 A | 4/2004 |
| JP | 2004-207479 | 7/2004 |
| JP | 2005-327826 | 11/2005 |
| WO | WO 03/005515 A1 | 1/2003 |

OTHER PUBLICATIONS

Chinese Office Action, with English translation, issued in Chinese Patent Application No. CN 2005100588419, mailed Jan. 18, 2008.

United States Office Action issued in U.S. Appl. No. 11/092,947, mailed Jan. 18, 2008.

United States Office Action issued in U.S. Appl. No. 11/092,947, mailed Sep. 27, 2007.

United States Office Action issued in U.S. Appl. No. 11/092,947, mailed Apr. 20, 2007.

Japanese Office Action, with partial English translation, issued in Japanese Patent Application No. 2004-253048, mailed Mar. 9, 2010.

* cited by examiner (a)

(b)

(a)

(b)

(a)

(b)

(a)

(b)

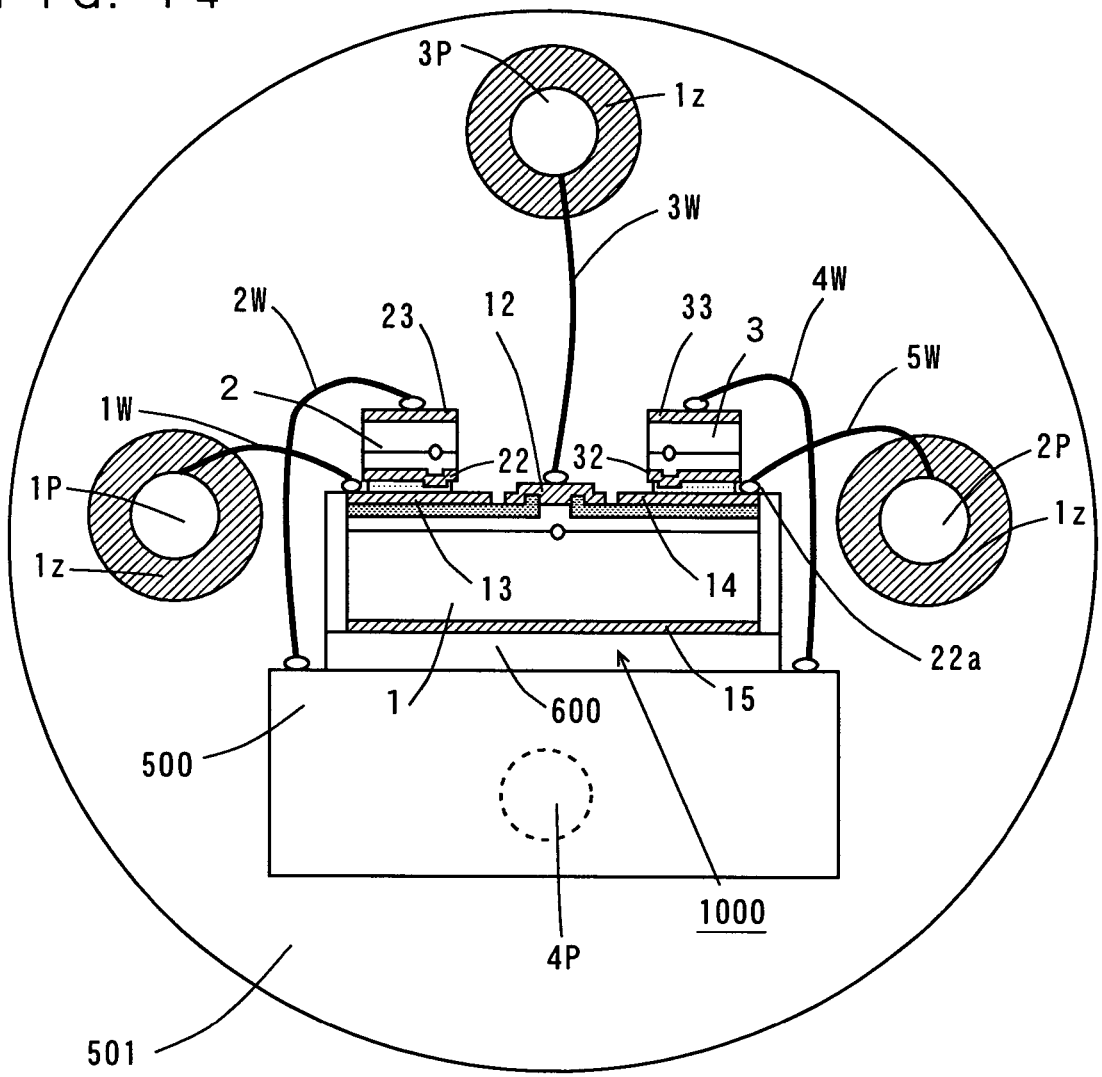
FIG. 14
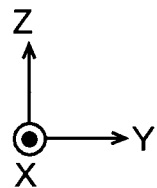

(a)

(b)

(a)

(b)

SEMICONDUCTOR LASER APPARATUS AND MANUFACTURING METHOD THEREOF

BACKGROUND OF THE INVENTION

1. Field of the Invention

The present invention relates to semiconductor laser apparatuses capable of emitting a plurality of light beams with different wavelengths, and manufacturing methods of such semiconductor laser apparatuses.

2. Description of the Background Art

Conventionally, semiconductor laser devices that emit infrared light with a wavelength of about 780 nm (infrared semiconductor laser devices) have been used as light sources in CD (Compact Disk)/CD-R (Compact Disk-Recordable) drives. Also, semiconductor laser devices that emit red light with a wavelength of about 650 nm (red semiconductor laser devices) have been used as light sources in DVD (Digital Versatile Disk) drives.

Meanwhile, the development of DVDs capable of recording and playback using blue-violet light with a wavelength of about 405 nm is recently proceeding. In order to play back and record such DVDs, the development of DVD drives using semiconductor laser devices that emit blue-light with a wavelength of about 405 nm (blue-violet semiconductor laser devices) is simultaneously proceeding. The DVD drives require compatibility with conventional CD/CD-Rs and DVDs.

Compatibility of a conventional CD or DVD with a new DVD is achieved by a method in which a plurality of optical pickups that emit infrared, red, and blue-violet light, respectively, are mounted in a DVD drive or by a method in which an infrared semiconductor laser device, a red semiconductor laser device, and a blue-violet semiconductor laser device are mounted in a single optical pickup. Such methods, however, cause increases in the parts count, thus making it difficult to produce smaller, simpler, and lower-cost DVD drives.

In order to prevent such increases in the parts count, an integrated semiconductor light emitting apparatus is suggested comprising a stack of a plurality of semiconductor light emitting devices with different wavelengths (refer to JP 2002-118331 A).

In the aforementioned integrated semiconductor light emitting apparatus, an InGaAlP-based 650-nm band semiconductor laser is formed on an InGaAlN-based 400-nm band semiconductor laser, for example.

In the apparatus comprising the stack of the InGaAlN-based 400-nm band semiconductor laser and the InGaAlP-based 650-nm band semiconductor laser, the InGaAlP-based 650-nm band semiconductor laser is more likely to be deformed by stress than the InGaAlN-based 400-nm band semiconductor laser.

Moreover, in the apparatus comprising the stack of an InGaAlN-based 400-nm band semiconductor laser and an AlGaAs-based 780-nm band semiconductor laser also, the AlGaAs-based 780-nm band semiconductor laser is more likely to be deformed by stress than the InGaAlN-based 400-nm band semiconductor laser. When the cavity facets of a semiconductor laser device are deformed by strain, the reliability thereof is reduced.

SUMMARY OF THE INVENTION

An object of the present invention is to provide semiconductor laser apparatuses capable of emitting a plurality of light beams having different wavelengths while having improved reliability and a smaller size, and methods of manufacturing such semiconductor laser apparatuses.

(1)

A semiconductor laser apparatus according to one aspect of the invention comprises a first semiconductor laser chip that is formed on a first substrate and has a first cavity, and a second semiconductor laser chip that is formed on a second substrate and has a second cavity, wherein the first semiconductor laser chip and the second semiconductor laser chip are stacked on each other so that the first cavity and the second cavity are aligned substantially parallel to each other, the length of the second cavity is greater than the length of the first cavity, and the modulus of elasticity of the second substrate is smaller than the modulus of elasticity of the first substrate.

In the semiconductor laser apparatus according to the invention, the first semiconductor laser chip is formed on the first substrate and has the first cavity. The first semiconductor laser chip and the second semiconductor laser chip are stacked on each other so that the first cavity and the second cavity are aligned substantially parallel to each other.

After bonding the first and second semiconductor laser chips on each other, stress is generated in each of the first and second semiconductor laser chips, attributed to the difference between the thermal expansion of each of the first and second semiconductor laser chips due to temperature changes. Note, however, that the modulus of elasticity of the second substrate in the second semiconductor laser chip is smaller than that of the first substrate in the first semiconductor laser chip. This means that the strain induced in the second substrate due to the stress generated in the second semiconductor laser chip is greater than the strain induced in the first substrate due to the stress generated in the first semiconductor laser chip.

The length of the second cavity of the second semiconductor laser chip is greater than the length of the first cavity of the first semiconductor laser chip. Accordingly, a portion of the second semiconductor laser chip near a facet thereof is not bonded to the first semiconductor laser chip. This reduces the strain in the facet of the second cavity of the second semiconductor laser chip. This prevents deterioration of the second semiconductor laser chip, and improves the reliability of the second semiconductor laser chip. As a result, the reliability of the semiconductor laser apparatus is improved.

In addition, the first and second semiconductor laser chips are stacked on each other, so that the width of the semiconductor laser apparatus can be made smaller. As a result, the size of the semiconductor laser apparatus can be reduced.

(2)

The length of the second cavity may be greater than the length of the first cavity by not less than the amount of the thickness of the second substrate.

In the semiconductor laser apparatus, strain is induced in the non-bonded portion of the second semiconductor laser chip by stress generated in the bonded portion of the first and second semiconductor laser chips. The strain induced in the non-bonded portion is significantly reduced at a position away from the bonded portion by the amount of the thickness of the second substrate. Accordingly, the strain in the facet of the second cavity is sufficiently reduced by setting the length of the second cavity greater than that of the first cavity by not less than the amount of the thickness of the second substrate. This sufficiently improves the reliability of the second semiconductor laser chip. As a result, the reliability of the semiconductor laser apparatus is sufficiently improved.

(3)

The first substrate may be made of a hexagonal material, the second substrate may be made of a cubic material, and the width of the first substrate in a direction vertical to a longitudinal direction of the first cavity may be greater than the width of the second substrate in a direction vertical to a longitudinal direction of the second cavity.

Since the first substrate is made of a hexagonal material in this case, when forming the facets of the first substrate vertical to the longitudinal direction of the first cavity by cleavage, it is difficult to form side surfaces of the first substrate parallel to the longitudinal direction of the first cavity by cleavage. It is thus not easy to make the width of the first substrate small.

In contrast, since the second substrate is made of a cubic material, when forming the facets of the second substrate vertical to the longitudinal direction of the second cavity by cleavage, it is easy to form side surfaces of the second substrate parallel to the longitudinal direction of the second cavity by cleavage. It is thus easy to make the width of the second substrate small.

Accordingly, the first semiconductor laser chip and the second semiconductor laser chip can be readily manufactured by setting the width of the first substrate greater than the width of the second substrate.

In addition, the first and second semiconductor laser chips are stacked on each other, so that the width of the first semiconductor laser chip is the maximum width of the stacked structure of the first and second semiconductor laser chips. This results in a small width of the semiconductor laser apparatus, and improved productivity.

(4)

The first substrate may be made of a nitride-based semiconductor, and the second substrate may be made of a gallium arsenide-based semiconductor.

In this case, since the nitride-based semiconductor is chemically stable, it is difficult to process by etching. Also, the nitride-based semiconductor is a hexagonal material, so that when forming the facets of the first substrate vertical to the longitudinal direction of the first cavity by cleavage, it is difficult to form side surfaces of the first substrate parallel to the longitudinal direction of the first cavity. It is thus not easy to make the width of the first substrate small.

In contrast, the gallium arsenide-based semiconductor is easy to process by etching. Also, the gallium arsenide-based semiconductor is a cubic material, so that when forming the facets of the second substrate vertical to the longitudinal direction of the second cavity by cleavage, it is easy to form side surfaces of the second substrate parallel to the longitudinal direction of the second cavity. It is thus easy to make the width of the second substrate small.

Thus, the first semiconductor laser chip and the second semiconductor laser chip can be readily manufactured by setting the width of the first substrate greater than the width of the second substrate.

(5)

The semiconductor laser apparatus may further comprise a base, and wherein the first semiconductor laser chip and the second semiconductor laser chip may be sequentially stacked on the base, the second semiconductor laser chip may have an electrode on a surface thereof opposite to the first semiconductor laser chip, and a wire may be connected to a position of the electrode of the second semiconductor laser chip above the first semiconductor laser chip.

Since the length of the second cavity of the second semiconductor laser chip is greater than that of the first cavity of the first semiconductor laser chip, a portion of the second semiconductor laser chip projects from the facet of the first semiconductor laser chip. In that case, the first semiconductor laser chip is not present below the projecting portion of the second semiconductor laser chip. When a load is downwardly applied to the projecting portion of the second semiconductor laser chip, the second semiconductor laser chip may be removed from the first semiconductor laser chip. The second semiconductor laser chip may also be damaged.

In the semiconductor laser apparatus, the wire is connected to the position of the electrode of the second semiconductor laser chip above the first semiconductor laser chip, so that the second semiconductor laser chip is prevented from being removed from the first semiconductor laser chip, and also prevented from damage.

(6)

The base may have a difference in level that is formed by an upper level surface and a lower level surface, the difference in level between the lower level surface and the upper level surface may be almost equivalent to the thickness of the first semiconductor laser chip, the first semiconductor laser chip may be provided on the lower level surface of the base, and a portion of the second semiconductor laser chip projecting from above the first semiconductor laser chip may be provided on the upper level surface of the base.

In this way, the base is present below the portion of the second semiconductor laser chip projecting from above the first semiconductor laser chip. This prevents the second semiconductor laser chip from being removed from the first semiconductor laser chip, and also prevented from damage, even when a load is downwardly applied to the projecting portion of the second semiconductor laser chip.

In addition, the projecting portion of the second semiconductor laser chip is in contact with the upper level surface of the base, so that heat is dissipated well from the projecting portion of the second semiconductor laser chip. This improves the reliability of the second semiconductor laser chip.

(7)

The semiconductor laser apparatus may further comprise a third semiconductor laser chip that is formed on a third substrate and has a third cavity, and wherein the second semiconductor laser chip and the third semiconductor laser chip may be arranged on the first semiconductor laser chip so that the first cavity, the second cavity, and the third cavity may be aligned substantially parallel to one another, the length of the third cavity may be greater than the length of the first cavity, and the modulus of elasticity of the third substrate may be smaller than the modulus of elasticity of the first substrate.

In this way, the third semiconductor laser chip is formed on the third substrate and has the third cavity. The second semiconductor laser chip and the third semiconductor laser chip are arranged on the first semiconductor laser chip so that the first cavity, the second cavity, and the third cavity are aligned substantially parallel to one another.

After stacking the second semiconductor laser chip and the third semiconductor laser chip on the first semiconductor laser chip, stress is generated in each of the first, second, and third semiconductor laser chips, attributed to the difference between the thermal expansion of each of the first, second, and third semiconductor laser chips due to temperature changes. The modulus of elasticity of the second substrate in the second semiconductor laser chip and the modulus of elasticity of the third substrate in the third semiconductor laser chip are smaller than that of the first substrate in the first semiconductor laser chip. This means that the strains induced in the second substrate and the third substrate due to the stresses generated in the second semiconductor laser chip and the third semiconductor laser chip are greater than the strain induced in the first substrate due to the stress generated in the first semiconductor laser chip.

Note, however, that the lengths of the second cavity of the second semiconductor laser chip and the third cavity of the third semiconductor laser chip are greater than the length of the first cavity of the first semiconductor laser chip. This reduces the strains in the facet of the second cavity of the second semiconductor laser chip and the facet of the third cavity of the third semiconductor laser chip. This prevents deterioration of the second semiconductor laser chip and the third semiconductor laser chip to improve the reliabilities of the second semiconductor laser chip and the third semiconductor laser chip. Accordingly, the reliability of the semiconductor laser apparatus is improved.

In addition, the second and third semiconductor laser chips are stacked on the first semiconductor laser chip, so that the width of the semiconductor laser apparatus can be made smaller. As a result, the size of the semiconductor laser apparatus can be reduced.

(8)

The length of the third cavity may be greater than the length of the first cavity by not less than the amount of the thickness of the third substrate.

In the semiconductor laser apparatus, strain is induced in the non-bonded portion of the third semiconductor laser chip by stress generated in the bonded portion of the first semiconductor laser chip and the third semiconductor laser chip. The strain induced in the non-bonded portion is significantly reduced at a position away from the bonded portion by the amount of the thickness of the third substrate. Accordingly, the strain in the facet of the third cavity is sufficiently reduced by setting the length of the third cavity greater than the length of the first cavity by the amount of not less than the thickness of the third substrate. This sufficiently improves the reliability of the third semiconductor laser chip. As a result, the reliability of the semiconductor laser apparatus is sufficiently improved.

(9)

The first substrate may be made of a hexagonal material, each of the second substrate and the third substrate may be made of a cubic material, and the width of the first substrate in a direction vertical to a longitudinal direction of the first cavity may be greater than the width of the second substrate in a direction vertical to a longitudinal direction of the second cavity and the width of the third substrate in a direction vertical to a longitudinal direction of the third cavity.

Since the first substrate is made of a hexagonal material in this case, when forming the facets of the first substrate vertical to the longitudinal direction of the first cavity by cleavage, it is difficult to form side surfaces of the first substrate parallel to the longitudinal direction of the first cavity by cleavage. It is thus not easy to make the width of the first substrate small.

In contrast, since the second substrate is made of a cubic material, when forming the facets of the second substrate vertical to the longitudinal direction of the second cavity by cleavage, it is easy to form side surfaces of the second substrate parallel to the longitudinal direction of the second cavity by cleavage. It is thus easy to make the width of the second substrate small.

Also, since the third substrate is made of a cubic material, when forming the facets of the third substrate vertical to the longitudinal direction of the third cavity by cleavage, it is easy to form side surfaces of the third substrate parallel to the longitudinal direction of the third cavity. It is thus easy to make the width of the third substrate small.

Accordingly, the first semiconductor laser chip, the second semiconductor laser chip, and the third semiconductor laser chip can be readily manufactured by setting the width of the first substrate greater than the widths of the second substrate and the third substrate.

In addition, the second semiconductor laser chip and the third semiconductor laser chip are stacked on the first semiconductor laser chip, so that the width of the first semiconductor laser chip is the maximum width of the stacked structure of the first, second, and third semiconductor laser chips. This results in a small width of the semiconductor laser apparatus, and improved productivity.

(10)

The first substrate may be made of a nitride-based semiconductor, and each of the second substrate and the third substrate may be made of a gallium arsenide-based semiconductor.

In this case, since the nitride-based semiconductor is chemically stable, it is difficult to process by etching. Also, the nitride-based semiconductor is a hexagonal material, so that when forming the facets of the first substrate vertical to the longitudinal direction of the first cavity by cleavage, it is difficult to form side surfaces of the first substrate parallel to the longitudinal direction of the first cavity by cleavage. It is thus not easy to make the width of the first substrate small.

In contrast, the gallium arsenide-based semiconductors are easy to process by etching. Also, the gallium arsenide-based semiconductors are cubic materials, so that when forming the facets of the second substrate vertical to the longitudinal direction of the second cavity by cleavage, it is easy to form side surfaces of the second substrate parallel to the longitudinal direction of the second cavity by cleavage. It is thus easy to make the width of the second substrate small.

In addition, when forming the facets of the third substrate vertical to the longitudinal direction of the third cavity by cleavage, it is easy to form side surfaces of the third substrate parallel to the longitudinal direction of the third cavity by cleavage. It is thus easy to make the width of the third substrate small Accordingly, the first semiconductor laser chip, the second semiconductor laser chip, and the third semiconductor laser chip can be readily manufactured by setting the width of the first substrate greater than the widths of the second substrate and the third substrate.

(11)

The semiconductor laser apparatus may further comprise a base, and wherein the first semiconductor laser chip may be stacked on the base, the second semiconductor laser chip and the third semiconductor laser chip may be stacked on the first semiconductor laser chip, each of the second semiconductor laser chip and the third semiconductor laser chip may have an electrode on a surface thereof opposite to the first semiconductor laser chip, and wires may be connected to positions of the electrodes of the second semiconductor laser chip and the third semiconductor laser chip above the first semiconductor laser chip.

Since the length of each of the second cavity of the second semiconductor laser chip and the third cavity of the third semiconductor laser chip is greater than that of the first cavity of the first semiconductor laser chip, a portion of each of the second semiconductor laser chip and the third semiconductor laser chip projects from a facet of the first semiconductor laser chip. In that case, the first semiconductor laser chip is not present below the projecting portions of the second semiconductor laser chip and the third semiconductor laser chip. When a load is downwardly applied to the projecting portions of the second semiconductor laser chip and the third semiconductor laser chip, the second semiconductor laser chip and the third semiconductor laser chip may be removed from the first semiconductor laser chip. The second semiconductor laser chip and the third semiconductor laser chip may also be damaged.

In the semiconductor laser apparatus, the wires are connected to the positions of the electrodes of the second semiconductor laser chip and the third semiconductor laser chip above the first semiconductor laser chip, so that the second semiconductor laser and the third semiconductor laser chip are prevented from being removed from the first semiconductor laser chip, and also prevented from damage.

(12)

The base may have a difference in level that is formed by a lower level surface and an upper level surface, the difference in level between the lower level surface and the upper level surface may be almost equivalent to the thickness of the first semiconductor laser chip, the first semiconductor laser chip may be provided on the lower level surface of the base, and a portion of each of the second semiconductor laser chip and the third semiconductor laser chip projecting from above the first semiconductor laser chip may be provided on the upper level surface of the base.

In this way, the base is present below the portions of the second and third semiconductor laser chips projecting from above the first semiconductor laser chip. This prevents the second and third semiconductor laser chips from being removed from the first semiconductor laser chip, and also prevented from damage, even when a load is downwardly applied to the projecting portions of the second and the third semiconductor laser chips.

In addition, the projecting portions of the second and the third semiconductor laser chips are in contact with the upper level surface of the base, so that heat is dissipated well from the projecting portions of the second and the third semiconductor laser chips. This improves the reliabilities of the second and the third semiconductor laser chips.

(13)

A method of manufacturing semiconductor laser apparatuses according to another aspect of the invention comprises the steps of forming the structures of a plurality of first semiconductor laser chips each having a first cavity on a first wafer, forming the structures of a plurality of second semiconductor laser chips each having a second cavity on a second wafer, laminating the first wafer and the second wafer so that the first cavities of the plurality of first semiconductor laser chips are aligned substantially parallel to the second cavities of the plurality of second semiconductor laser chips, and dividing the first wafer and the second wafer into the plurality of first and second semiconductor laser chips so that the length of the second cavity of each of the second semiconductor laser chips is greater than the length of the first cavity of each of the first semiconductor laser chips, so as to form a plurality of semiconductor laser apparatuses each having a stacked structure of a first semiconductor laser chip and a second semiconductor laser chip, wherein the modulus of elasticity of the second wafer is smaller than the modulus of elasticity of the first wafer.

In the manufacturing method according to the invention, the structures of the plurality of first semiconductor laser chips each having the first cavity are formed on the first wafer, and the structures of the plurality of second semiconductor laser chips each having the second cavity are formed on the second wafer. Next, the first wafer and the second wafer are laminated so that the first cavities of the plurality of first semiconductor laser chips are aligned substantially parallel to the second cavities of the plurality of second semiconductor laser chips. Then, the first and the second wafers are divided into the plurality of first and second semiconductor laser chips so that the length of the second cavity of each second semiconductor laser chip is greater than the length of the first cavity of each first semiconductor laser chip. In this way, the plurality of semiconductor laser apparatuses are formed each having the stacked structure of first and second semiconductor laser chips.

According to this method, each of the plurality of first semiconductor laser chips and each of the plurality of second semiconductor laser chips are stacked on each other by laminating the first wafer and the second wafer. In this way, when the first wafer and the second wafer are positioned, the plurality of first and second semiconductor laser chips are simultaneously positioned, which improves the positioning accuracy, and reduces the time necessary for positioning. This improves the yields of semiconductor laser apparatuses while reducing the manufacturing time and cost.

After stacking a first semiconductor laser chip and a second semiconductor laser chip on each other, stress is generated in each of the first and second semiconductor laser chips, attributed to the difference between the thermal expansion of each of the first and second semiconductor laser chips due to temperature changes. The modulus of elasticity of the second substrate in the second semiconductor laser chip is smaller than that of the first substrate of the first semiconductor laser chip. This means that the strain induced in the second substrate due to the stress generated in the second semiconductor laser chip is greater than the strain induced in the first substrate due to the stress generated in the first semiconductor laser chip.

Note, however, that the length of the second cavity of the second semiconductor laser chip is greater than the length of the first cavity of the first semiconductor laser chip. This reduces the strain in a facet of the second semiconductor laser chip. This prevents deterioration of the second semiconductor laser chip and improves the reliability. Accordingly, the reliabilities of the semiconductor laser apparatuses are improved.

In addition, the first semiconductor laser chip is stacked on the second semiconductor laser chip, so that the width of a semiconductor laser apparatus can be made smaller. As a result, the size of the semiconductor laser apparatuses can be reduced.

(14)

The step of forming the plurality of semiconductor laser apparatuses may include the step of dividing the first and second wafers into the plurality of first and second semiconductor laser chips so that the second cavity of each of the second semiconductor laser chips is greater than the first cavity of each of the first semiconductor laser chips by not less than the amount of the thickness of each of the second semiconductor laser chips.

In each of the semiconductor laser apparatuses, stress generated in a bonded portion of the first semiconductor laser chip and the second semiconductor laser chip induces strain in a non-bonded portion of the second semiconductor laser chip. The strain induced in the non-bonded portion is significantly reduced at a position away from the bonded portion by the amount of the thickness of the second substrate. Accordingly, the strain in a facet of the second cavity is sufficiently reduced by setting the length of the second cavity greater than that of the first cavity by not less than the amount of the thickness of the second substrate. This sufficiently improves the reliability of the second semiconductor laser chip. As a result, the reliabilities of the semiconductor laser apparatuses are sufficiently improved.

(15)

The step of forming the structures of the plurality of first semiconductor laser chips may include the step of preparing the first wafer made of a hexagonal material, the step of forming the structures of the plurality of second semiconductor laser chips may include the step of preparing the second wafer made of a cubic material, and the step of forming the plurality of semiconductor laser apparatuses may include the step of dividing the first wafer and the second wafer so that the width of each of the first semiconductor laser chips in a direction vertical to a longitudinal direction of the first cavity is greater than the width of each of the second semiconductor laser chips in a longitudinal direction of the second cavity.

Since the first wafer is made of a hexagonal material in this case, when forming the facets of a first semiconductor laser chip vertical to the longitudinal direction of the first cavity by cleavage, it is difficult to form side surfaces of the first semiconductor laser chip parallel to the longitudinal direction of the first cavity by cleavage. It is thus not easy to make the width of the first substrate small.

In contrast, since the second wafer is made of a cubic material, when forming the facets of a second semiconductor laser chip vertical to the longitudinal direction of the second cavity by cleavage, it is easy to form side surfaces of the second semiconductor laser chip parallel to the longitudinal direction of the second cavity by cleavage. It is thus easy to make the width of the second substrate small.

Accordingly, the first semiconductor laser chip and the second semiconductor laser chip can be readily manufactured by setting the width of the first semiconductor laser chip greater than the width of the second semiconductor laser chip.

In addition, the first semiconductor laser chip and the second semiconductor laser chip are stacked on each other, so that the width of the first semiconductor laser chip is the maximum width of the stacked structure of the first and second semiconductor laser chips. This results in a small width of the semiconductor laser apparatuses, and improved productivity.

(16)

The step of preparing the first wafer may include the step of preparing the first wafer made of a nitride-based semiconductor, and the step of preparing the second wafer may include the step of preparing the second wafer made of a gallium arsenide-based semiconductor.

In this case, since the nitride-based semiconductor is chemically stable, the first wafer is difficult to process by etching. Also, the nitride-based semiconductor is a hexagonal material, so that when forming the facets of a first semiconductor laser chip vertical to the longitudinal direction of the first cavity by cleavage, it is difficult to form side surfaces of the first semiconductor laser chip parallel to the longitudinal direction of the first cavity by cleavage. It is thus not easy to make the width of the first semiconductor laser chip small.

In contrast, the gallium arsenide-based semiconductor is easy to process by etching. Also, the gallium arsenide-based semiconductor is a cubic material, so that when forming the facets of a second semiconductor laser chip vertical to the longitudinal direction of the second cavity by cleavage, it is easy to form side surfaces of the second semiconductor laser chip parallel to the longitudinal direction of the second cavity by cleavage. It is thus easy to make the width of the second semiconductor laser chip small.

Accordingly, the first semiconductor laser chip and the second semiconductor laser chip can be readily manufactured by setting the width of the first semiconductor laser chip greater than the width of the second semiconductor laser chip.

(17)

The step of forming the structures of the second semiconductor laser chips may include the step of forming an electrode on one surface of each of the second semiconductor laser chips, and the step of laminating the first wafer and the second wafer may include the step of laminating the first wafer and the second wafer so that the electrode formed on the one surface of each of the second semiconductor laser chips is positioned on a surface opposite to each of the first semiconductor laser chips. The manufacturing method may further comprise, subsequent to the step of forming the plurality of semiconductor laser apparatuses, the steps of preparing a base, stacking the semiconductor laser apparatuses on the base so that each of the second semiconductor laser chips is positioned on each of the first semiconductor laser chips, and connecting a wire to a position of the electrode of each of the second semiconductor laser chips above each of the first semiconductor laser chips.

Since the length of the second cavity of a second semiconductor laser chip is greater than that of the first cavity of a first semiconductor laser chip, a portion of the second semiconductor laser chip projects from a facet of the first semiconductor laser chip. In that case, the first semiconductor laser chip is not present below the projecting portion of the second semiconductor laser chip. When a load is downwardly applied to the projecting portion of the second semiconductor laser chip, the second semiconductor laser chip may be removed from the first semiconductor laser chip. The second semiconductor laser chip may also be damaged.

In the semiconductor laser apparatus, the wire is connected to the position of the electrode of the second semiconductor laser chip above the first semiconductor laser chip, so that the second semiconductor laser chip is prevented from being removed from the first semiconductor laser chip, and also prevented from damage.

(18)

The step of preparing the base may include the step of preparing the base having a difference in level that is formed by a lower level surface and an upper level surface, the difference in level between the lower level surface and the upper level surface may be almost equivalent to the thickness of each of the first semiconductor laser chips, the step of stacking the semiconductor laser apparatuses on the base may include the step of stacking the semiconductor laser apparatuses on the base so that each of the first semiconductor laser chips is positioned on the lower level surface of the base, and a portion of each of the second semiconductor laser chips projecting from above each of the first semiconductor laser chips may be positioned on the upper level surface of the base.

In this way, the base is present below the portion of a second semiconductor laser chip projecting from above a first semiconductor laser chip. This prevents the second semiconductor laser chip from being removed from the first semiconductor laser chip, and also prevented from damage, even when a load is downwardly applied to the projecting portion of the second semiconductor laser chip.

In addition, the projecting portion of the second semiconductor laser chip is in contact with the upper level surface of the base, so that heat is dissipated well from the projecting portion of the second semiconductor laser chip. This improves the reliability of the second semiconductor laser chip.

As described above, according to the semiconductor laser apparatuses and the manufacturing method thereof in the invention, semiconductor laser apparatuses are provided capable of emitting a plurality of light beams with different wavelengths while having improved reliability and a smaller size.

The foregoing and other objects, features, aspects and advantages of the present invention will become more appar-

BRIEF DESCRIPTION OF THE DRAWINGS

FIG. 14 is a schematic front view of a semiconductor laser apparatus according to a second embodiment;

DESCRIPTION OF THE PREFERRED EMBODIMENTS

Semiconductor laser apparatuses and manufacturing methods thereof according to embodiments of the invention will be described below.

First Embodiment

In the specification, a one-chip semiconductor laser device refers to a semiconductor laser device obtained by integrating a plurality of semiconductor laser devices described below into a single chip.

FIGS. 1(a) and 1(b) are a schematic cross section and a schematic top view, respectively, showing an example of a one-chip semiconductor laser device for use in a semiconductor laser apparatus according to a first embodiment. FIG. 1(a) shows a schematic cross section of the one-chip semiconductor laser device 1000, and FIG. 1(b) shows a schematic top view of the one-chip semiconductor laser device 100.

Figure 1:
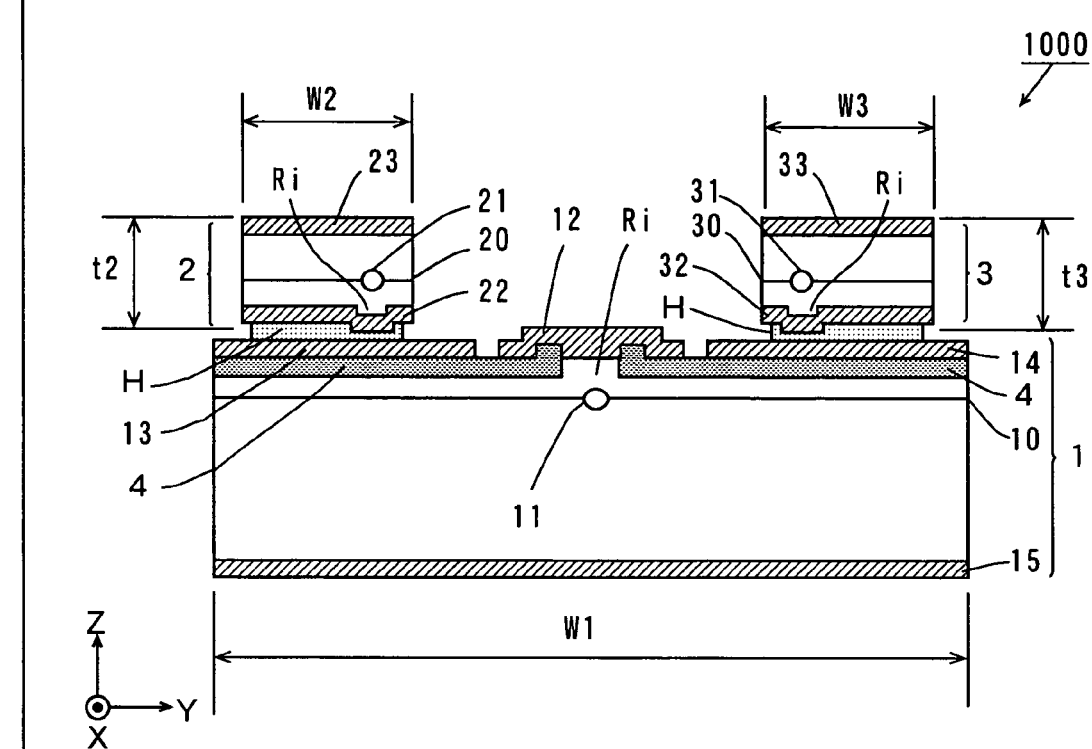
FIGS. 1(a) and 1(b) are a schematic cross section and a schematic top view, respectively, showing an example of a one-chip semiconductor laser device for use in a semiconductor laser apparatus according to a first embodiment.
Figure 1:
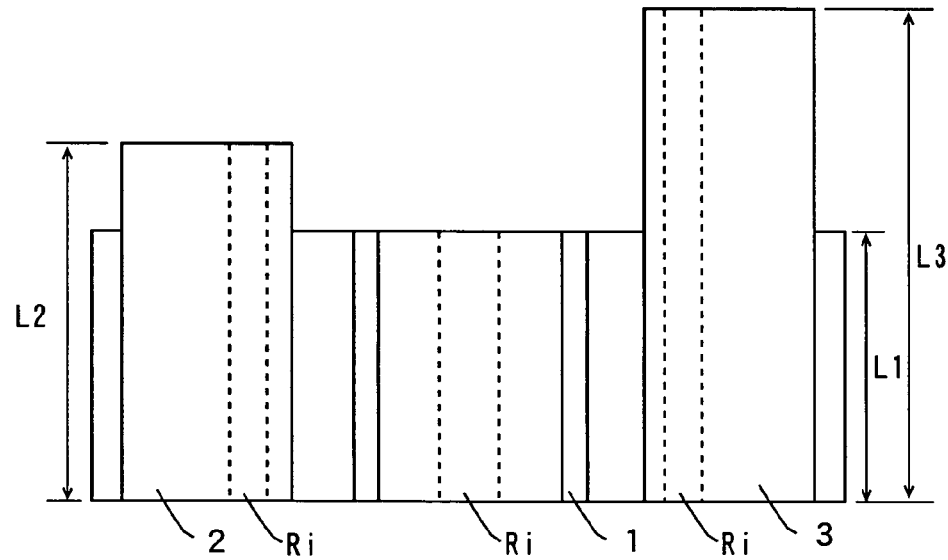

In the specification, as indicated by the arrows X, Y, Z in FIG. 1, two directions perpendicular to each other in a horizontal plane are defined as X and Y directions, and a direction vertical to the X and Y directions is defined as Z direction. The X, Y, and Z directions are similarly defined also in the drawings subsequent to FIG. 1.

The X and Y directions are parallel to the p-n junction surface of each of a blue-violet semiconductor laser device, a red semiconductor laser device, and an infrared semiconductor laser device described below. The Z direction is vertical to the p-n junction of each of these devices.

The one-chip semiconductor laser device 1000 in the embodiment has a stacked structure that includes a semiconductor laser device 1 emitting a laser beam with a wavelength of about 400 nm (hereinafter referred to as a blue-violet semiconductor laser device 1), a semiconductor laser device 2 emitting a laser beam with a wavelength of about 650 nm (hereinafter referred to as a red semiconductor laser device 2), and a semiconductor laser device 3 emitting a laser beam with a wavelength of about 780 nm (hereinafter referred to as an infrared semiconductor laser device 3).

The blue-violet semiconductor laser device 1 is manufactured by forming semiconductor layers on a Ga (0001) substrate, and then forming a ridge that extends in the [1$\bar{1}$00] direction. Each of the red semiconductor laser device 2 and the infrared semiconductor laser device 3 is manufactured by forming semiconductor layers on a GaAs (001) substrate, and then forming a ridge that extends in the [1$\bar{1}$0] direction. Note that the modulus of elasticity of GaAs in the red semiconductor laser device 2 and the infrared semiconductor laser device 3 is smaller than GaN in the blue-violet semiconductor laser device 1. Table 1 below shows the modulus of elasticity tensors for the semiconductor materials (GaN, GaAs, GaP, InP) used in this embodiment. GaN is a hexagonal material, and GaAs is a cubic material, as will be described in detail below.

TABLE 1

|  | $C_{11}$ [GPa] | $C_{12}$ [GPa] | $C_{13}$ [GPa] | $C_{33}$ [GPa] | $C_{44}$ [GPa] |
| --- | --- | --- | --- | --- | --- |
| GaN | 390 | 145 | 106 | 398 | 105 |
| GaAs | 121.1 | 54.8 | — | — | 60.4 |
| GaP | 140.5 | 62.03 | — | — | 70.33 |
| InP | 102.2 | 57.6 | — | — | 4.6 |

As shown in FIG. 1(a) and FIG. 1(b), the blue-violet semiconductor laser device 1 has a striped ridge portion Ri that extends in the X direction on an upper surface side thereof. In the blue-violet semiconductor laser device, an insulating film 4 is formed on both sides of the ridge portion Ri, a p-side pad electrode 12 is formed so as to cover an upper surface of the ridge portion Ri, and an n-electrode 15 is formed on a lower surface of the blue-violet semiconductor laser device. A p-n junction surface 10, i.e., an interface of ap-type semiconductor and an n-type semiconductor, is formed in the blue-violet semiconductor laser device 1.

The red semiconductor laser device 2 has an n-electrode 23 formed on an upper surface thereof and a p-electrode 22 formed on a lower surface thereof. The red semiconductor laser device 2 has a striped ridge portion Ri that extends in the X direction on the lower surface side thereof. A p-electrode 22 is formed so as to cover the ridge portion Ri. A p-n junction plane 20, i.e., an interface between a p-type semiconductor and an n-type semiconductor, is formed in the red semiconductor laser device 2.

The infrared semiconductor laser device 3 has an n-electrode 33 formed on an upper surface thereof and a p-electrode 32 formed on a lower surface thereof. The infrared semiconductor laser device 3 has a striped ridge portion Ri that extends in the X direction on the lower surface side thereof. A p-electrode 32 is formed so as to cover the ridge portion Ri. A p-n junction surface 30, i.e., an interface between a p-type semiconductor and an n-type semiconductor, is formed in the infrared semiconductor laser device 3.

P-side pad electrodes 13, 14 are formed on the insulating film 4 in the blue-violet semiconductor laser device 1 at a distance from the p-side pad electrode 12.

Solder films H are formed on upper surfaces of the p-side pad electrodes 13, 14, respectively. The p-electrode 22 in the red semiconductor laser device 2 is bonded on the p-side pad electrode 13 through the solder film H. The p-electrode 32 in the infrared semiconductor laser device 3 is bonded on the p-side pad electrode 14 through the solder film H.

In this way, the p-electrode 22 and the p-side pad electrode 13 in the red semiconductor laser device 2 are electrically connected, and the p-electrode 32 and the p-side pad electrode 14 in the infrared semiconductor laser device 3 are electrically connected.

When voltage is applied between the p-side pad electrode 12 and the n-electrode 15 in the blue-violet semiconductor laser device 1, a laser beam with a wavelength of about 400 nm is emitted in the X direction from a region (hereinafter referred to as a blue-violet beam emission point) 11 below the ridge portion Ri in the p-n junction surface 10.

When voltage is applied between the p-electrode 22 and the n-electrode 23 in the red semiconductor laser device 2, a laser beam with a wavelength of about 650 nm is emitted in the X direction from a region (hereinafter referred to as a red beam emission point) 21 below the ridge portion Ri in the p-n junction surface 20.

When voltage is applied between the p-electrode 32 and the n-electrode 33 in the infrared semiconductor laser device 3, a laser beam with a wavelength of about 780 nm is emitted in the X direction from a region (hereinafter referred to as an infrared beam emission point) 31 below the ridge portion Ri in the p-n junction surface 30.

The red semiconductor laser device 2 and the infrared semiconductor laser device 3 are stacked on the blue-violet semiconductor laser device 1 so that the ridge portions Ri of the red semiconductor laser device 2, the infrared semiconductor laser device 3, and the blue-violet semiconductor laser device 1 are aligned parallel to the X direction. This allows the paths of the laser beams emitted from the blue-violet semiconductor laser device 1, red semiconductor laser device 2, and infrared semiconductor laser device 3 to be aligned substantially parallel to one another.

In the specification, of the facets (cavity facets) vertical to the X direction of each of the blue-violet semiconductor laser device 1, red semiconductor laser device 2, and infrared semiconductor laser device 3, the facet emitting a greater amount of laser beam is referred to as a first facet, and the facet emitting a smaller amount of laser beam is referred to a second facet. The front surface as mentioned in the specification defines a direction in which a greater amount of laser beam is emitted from each of the semiconductor laser devices.

As shown in FIG. 1(b), the first facets of the blue-violet semiconductor laser device 1, the red semiconductor laser device 2, and the infrared semiconductor laser device 3 are arranged substantially in line in the Y direction.

As shown in FIG. 1(a), the thickness of the red semiconductor laser device 2 (in the Z direction) is defined as t2, and the thickness of the infrared semiconductor laser device 3 (in the Z direction) is defined as t3.

The width of the blue-violet semiconductor laser device 1 (in the Y direction) is defined as W1, the width of the red semiconductor laser device 2 (in the Y direction) is defined as W2, and the width of the infrared semiconductor laser device 3 (in the Y direction) is defined as W3.

Moreover, as shown in FIG. 1(b), the length of the blue-violet semiconductor laser device 1 (in the X direction) is defined as L1, the length of the red semiconductor laser device 2 (in the X direction) is defined as L2, and the length of the infrared semiconductor laser device 3 (in the X direction) is defined as L3.

In this embodiment, the length L2 of the red semiconductor laser device 2 and the length L3 of the infrared semiconductor laser device 3 are longer than the length L1 of the blue-violet semiconductor laser device 1.

As described above, the modulus of elasticity of each of the GaAs substrates is smaller than that of the GaN substrate. In this case, the GaAs substrates are deformed more greatly than the GaN substrate by stress when bonding the blue-violet semiconductor laser device 1 with the red semiconductor laser device 2 and the infrared semiconductor laser device 3.

In this embodiment, however, the length L2 for the red semiconductor laser device 2 and the length L3 for the infrared semiconductor laser device 3 are longer than the length L1 for the blue-violet semiconductor laser device 1.

Accordingly, a portion near a facet (cavity facet) of each of the red semiconductor laser device 2 and the infrared semiconductor laser device 3 in the X direction is not bonded to the blue-violet semiconductor laser device 1. This reduces the strain in the cavity facet of each of the red semiconductor laser device 2 and the infrared semiconductor laser device in the X direction. This prevents deterioration of the red semiconductor laser device 2 and the infrared semiconductor laser device 3 to improve the reliabilities of the red semiconductor laser device 2 and the infrared semiconductor laser device 3. As a result, the reliability of the semiconductor laser apparatus according to the embodiment is improved.

More specifically, the lengths of the blue-violet semiconductor laser device 2, the red semiconductor laser device 2, and the infrared semiconductor laser device 3 (in the X direction) in this embodiment have the relationships represented by the equations (1) and (2) shown below:

$$L2-L1 \geq t2 \tag{1}$$

$$L3-L1 \geq t3 \tag{2}$$

Stress generated in the bonded portion of the blue-violet semiconductor laser device 1 with the red semiconductor laser device 2 and the infrared semiconductor laser device 3 induces strains in the non-bonded portions of the red semiconductor laser device 2 and the infrared semiconductor laser device 3. The strains induced in the non-bonded portions is significantly reduced at the positions away from the bonded portion by the thickness t2 of the red semiconductor laser device 2 and the thickness t3 of the infrared semiconductor laser device 3.

Hence, by setting the lengths of the blue-violet semiconductor laser device 1, the red semiconductor laser device 2, and the infrared semiconductor laser device 3 so as to satisfy the relationships of the aforementioned equations (1) and (2), the strain on the facet of each of the red semiconductor laser device 2 and the infrared semiconductor laser device 3 in the X direction is sufficiently reduced.

This improves the reliabilities of the red semiconductor laser device 2 and the infrared semiconductor laser device 3 sufficiently. As a result, the reliability of the semiconductor apparatus is sufficiently improved.

As described above, the GaN substrate made of a hexagonal material is used in the blue-violet semiconductor laser device, and the GaAs substrate made of a cubic material is used in each of the red semiconductor laser device 2 and the infrared semiconductor laser device 3. In this embodiment, the width W1 of the blue-violet semiconductor laser device 1 is longer than the width W2 of the red semiconductor laser device 2 and the width W3 of the infrared semiconductor laser device 3.

Since the GaN substrate is made of a hexagonal material, when forming the facets of the blue-violet semiconductor laser device 1 vertical to the X direction by cleavage, it is difficult to form side surfaces of the blue-violet semiconductor laser device 1 parallel to the X direction by cleavage. It is therefore not easy to make the width W1 of the blue-violet semiconductor laser device 1 small.

In contrast, since each of the GaAs substrates is made of a cubic material, when forming the facets of each of the red semiconductor laser device 2 and the infrared semiconductor laser device 3 vertical to the X direction by cleavage, it is easy to form side surfaces of each of the red semiconductor laser device 2 and the infrared semiconductor laser device 3 parallel to the X direction by cleavage. It is therefore easy to make the width W2 of the red semiconductor laser device 2 and the width W3 of the infrared semiconductor laser device 3 in the Y direction small.

Thus, the blue-violet semiconductor laser device 1, the red semiconductor laser device 2, and the infrared semiconductor laser device 3 can be readily manufactured by setting the width W1 of the GaN substrate in the blue-violet semiconductor laser device 1 greater than the width W2 of the GaAs substrate in the red semiconductor laser device 2 and the width W3 of the GaAs substrate in the infrared semiconductor laser device 3.

In addition, since the red semiconductor laser device 2 and the infrared semiconductor laser device 3 are stacked on the blue-violet semiconductor laser device 1, the width W1 of the blue-violet semiconductor laser device 1 is the maximum width of the stacked structure of the one-chip semiconductor laser apparatus 1000. This results in a small width of the semiconductor laser apparatus, and improved productivity.

Figure 2:
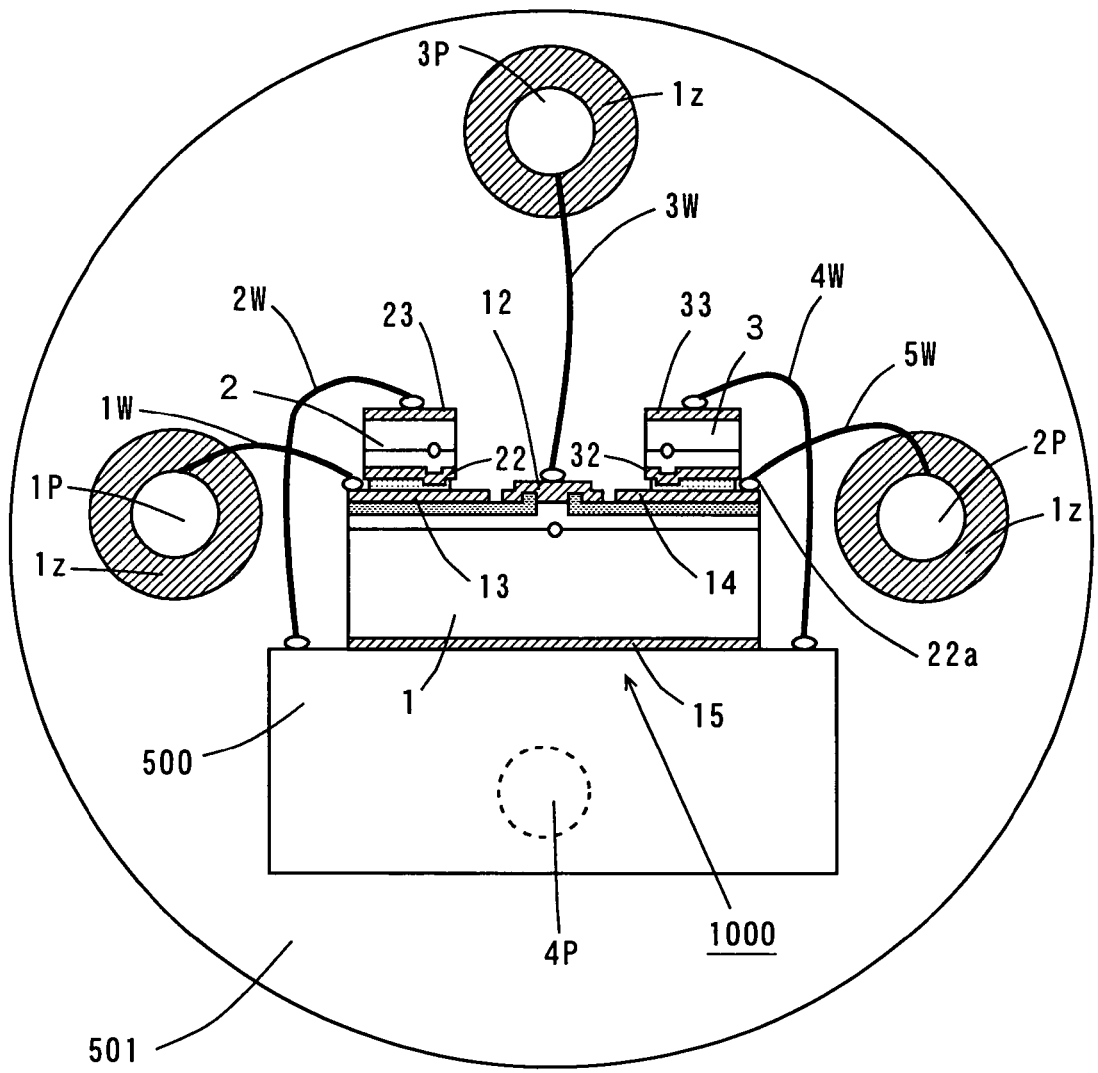
FIG. 2 is a schematic front view of a semiconductor laser apparatus according to the first embodiment.
Figure 3:
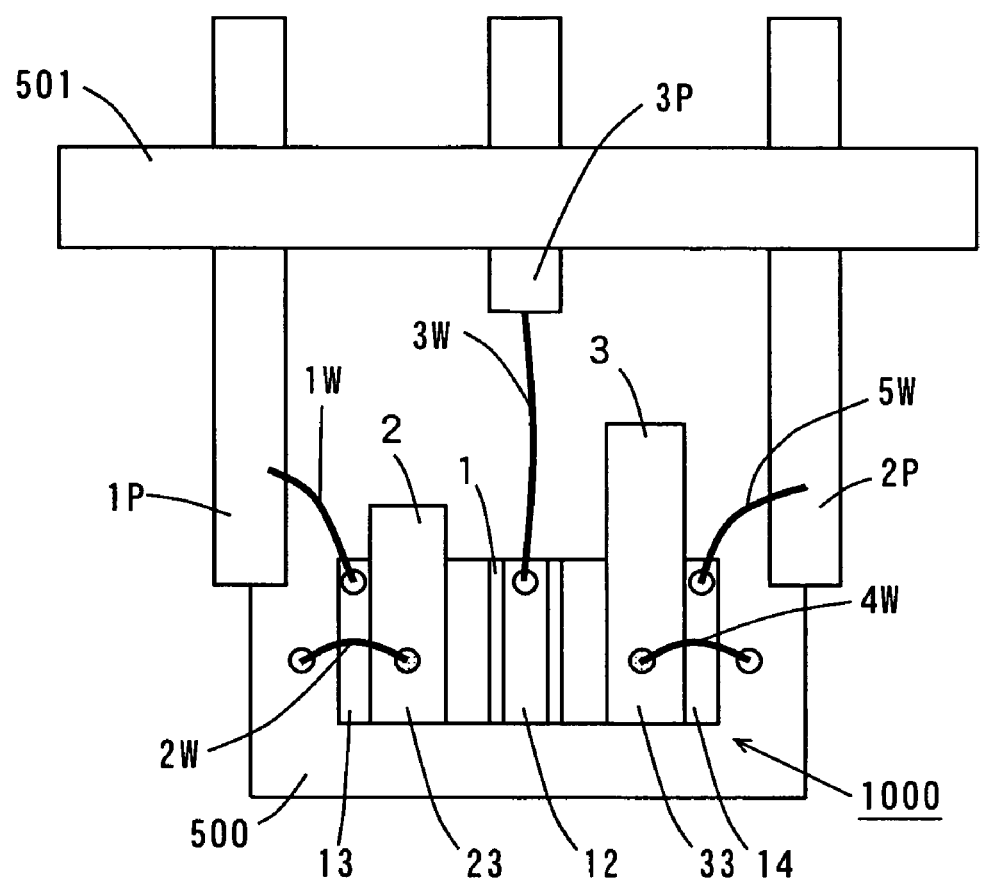
FIG. 3 is a schematic top view of the semiconductor laser apparatus according to the first embodiment.
Figure 3:
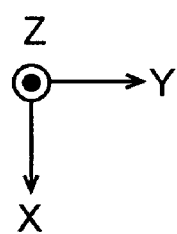

FIG. 2 is a schematic front view of the semiconductor laser apparatus according to the first embodiment. FIG. 3 is a schematic top view of the semiconductor laser apparatus according to the first embodiment.

As shown in FIG. 2 and FIG. 3, the semiconductor laser apparatus according to the embodiment comprises a one-chip semiconductor laser device 1000, a stem 500, a base 501, a first terminal 1P, a second terminal 2P, a third terminal 3P, a fourth terminal 4P, and a plurality of wires 1W, 2W, 3W, 4W, 5W.

The electrically conductive stem 500 made of a metal such as Cu, CuW or Al is mounted on the electrically conductive base 501.

The one-chip semiconductor laser device 1000 in FIG. 1 is mounted on the stem 500. Then, using the wires 1W, 2W, 3W, 4W, 5W, a p-side pad electrode 12, p-electrodes 22, 32, and n-electrodes 23, 33 are wired.

The base 501 is attached with the first terminal 1P, second terminal 2P, third terminal 3P, and fourth terminal 4P. The length of the third terminal 3P is shorter than the lengths of the first terminal 1P and the second terminal 2P.

The first terminal 1P is insulated from the base 501 through an insulating ring 1z, the second terminal 2P is insulated from the base 501 through an insulating ring 1z, and the third terminal 1P is insulated from the base 501 through an insulating ring 1z. The fourth terminal 4P, which is mounted on the base 501, is electrically continuous with the stem 500.

The first terminal 1P and the second terminal 2P are arranged at a distance from each other in the Y direction, and the third terminal 3P and the fourth terminal 4P are arranged at a distance from each other in the Z direction that crosses with the Y direction. The first terminal 1P, second terminal 2P, and third terminal 3P extend from one surface side of the base 501 to another along the X direction.

A red semiconductor laser device 1, an infrared semiconductor laser device 2, and a blue-violet semiconductor laser device 3 are arranged between the first terminal 1P and the second terminal 2P in the Y direction.

In this case, an n-electrode 15 is bonded to an upper surface of the stem 500. This allows for an electrical connection between the n-electrode 15 and the stem 500.

As shown in FIG. 2 and FIG. 3, the first terminal 1P is electrically connected to a p-type pad electrode 13 on the blue-violet semiconductor laser device 1 through the wire 1W. This allows for an electrical connection between the first terminal 1P and the p-electrode 22 in the red semiconductor laser device 2.

The second terminal 2P is electrically connected to the p-type pad electrode 14 on the blue-violet semiconductor laser device 1 through the wire 5W. This allows for an electrical connection between the second terminal 2P and the p-electrode 32 in the infrared semiconductor laser device 3.

The third terminal 3P is electrically connected to the p-side pad electrode 12 on the blue-violet semiconductor laser device 1 through the wire 3W. The stem 500 is electrically connected to the n-electrode 23 on the red semiconductor laser device 2 through the wire 2W. The stem 500 is electrically connected also to the n-electrode 33 on the infrared semiconductor laser device 3 through the wire 4W.

Note that the stem 500 is electrically connected to the fourth terminal 4P. This allows for an electrical connection between the fourth terminal 4P, the n-electrode 23 in the red semiconductor laser device 2, and the n-electrode 33 in the infrared semiconductor laser device 3.

Consequently, when voltage is applied between the third terminal 3P and the fourth terminal 4P, the blue-violet semiconductor laser device 1 is driven. When voltage is applied between the first terminal 1P and the fourth terminal 4P, the red semiconductor laser device 2 is driven. When voltage is applied between the second terminal 2P and the fourth terminal 4P, the infrared semiconductor laser device 3 is driven.

In driving the blue-violet semiconductor laser device 1, for example, positive voltage is applied to the third terminal 3P, and negative voltage is applied to the fourth terminal 4P. In driving the red semiconductor laser device 2, positive voltage is applied to the first terminal 1P and the fourth terminal 4P is held at the ground potential. In driving the infrared semiconductor laser device 3, positive voltage is applied to the second terminal 2P, and the fourth terminal 4P is held at the ground potential.

By the way, as shown in FIG. 3, the wire 2W is connected to the n-electrode 23 in the region of the blue-violet semiconductor laser device 1 in the X and Y directions. In other words, the wire 2W is connected to the n-electrode 23 located on the blue-violet semiconductor laser device 1.

The wire 4W is connected to the n-electrode 33 in the region of the blue-violet semiconductor laser device 1 in the X and Y directions. In other words, the wire 4W is connected to the n-electrode 33 located on the blue-violet semiconductor laser device 1.

In this way, the wires 2W, 4W are not connected to the portions of the red semiconductor laser device 2 and the infrared semiconductor laser device 3 projecting from the blue-violet semiconductor laser device 1.

As described above, the lengths of the red semiconductor laser device 2 and the infrared semiconductor laser device 3 are longer than that of the blue-violet semiconductor laser device 1, so that portions of the red semiconductor laser device 2 and the infrared semiconductor laser device 3 project from a facet of the blue-violet semiconductor laser device 1.

In this case, the blue-violet semiconductor laser device 1 is not present below the projecting portions of the red semiconductor laser device 2 and the infrared semiconductor laser device 3. When a load is downwardly applied to the projecting portions of the red semiconductor laser device 2 and the infrared semiconductor laser device 3, the red semiconductor laser device 2 and the infrared semiconductor laser device 3 may be removed from the blue-violet semiconductor laser device 1. The red semiconductor laser device 2 and the infrared semiconductor laser device 3 may also be damaged.

In this embodiment, the red semiconductor laser device 2 and the infrared semiconductor laser device 3 are prevented from being removed from the blue-violet semiconductor laser device 1 and also prevented from damage by connecting the wire 2W to the n-electrode 23 in the red semiconductor laser device 2 and connecting the wire 4W to the n-electrode 33 in the infrared semiconductor laser device 3 above the blue-violet semiconductor laser device 1.

Now, manufacturing methods and structures of the blue-violet semiconductor laser device 1, red semiconductor laser device 2, and infrared semiconductor laser device 3 will be described in detail.

FIGS. 4(a), 4(b), FIGS. 5(c), 5(d), FIGS. 6(e), 6(f), FIG. 7(g), and FIG. 8(h) are cross sections for illustrating the manufacturing method and the structure of the blue-violet semiconductor laser device 1 in detail.

Figure 4:
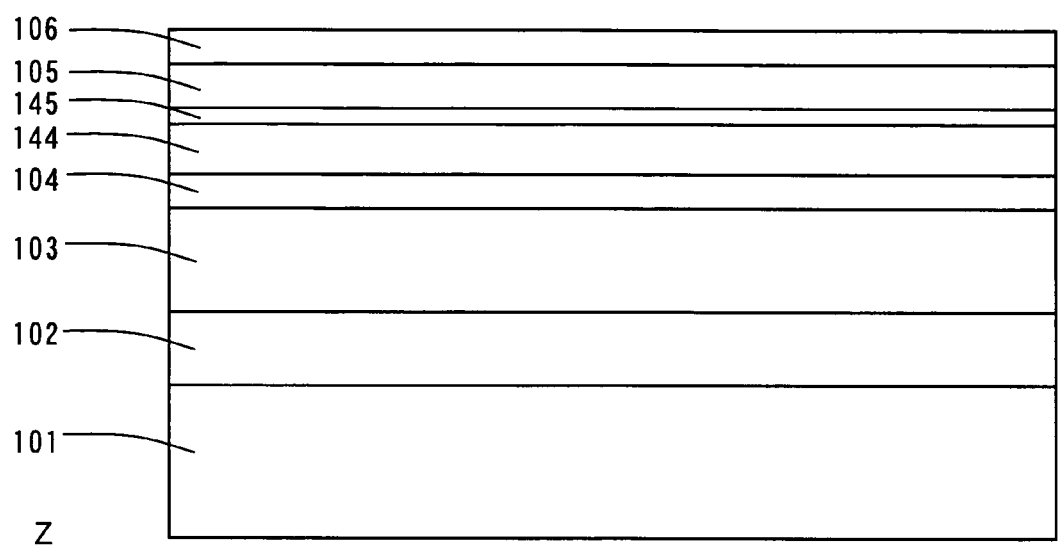
FIGS. 4(a) and 4(b) are cross sections for illustrating the manufacturing method and the structure of a blue-violet semiconductor laser device in detail.
Figure 4:
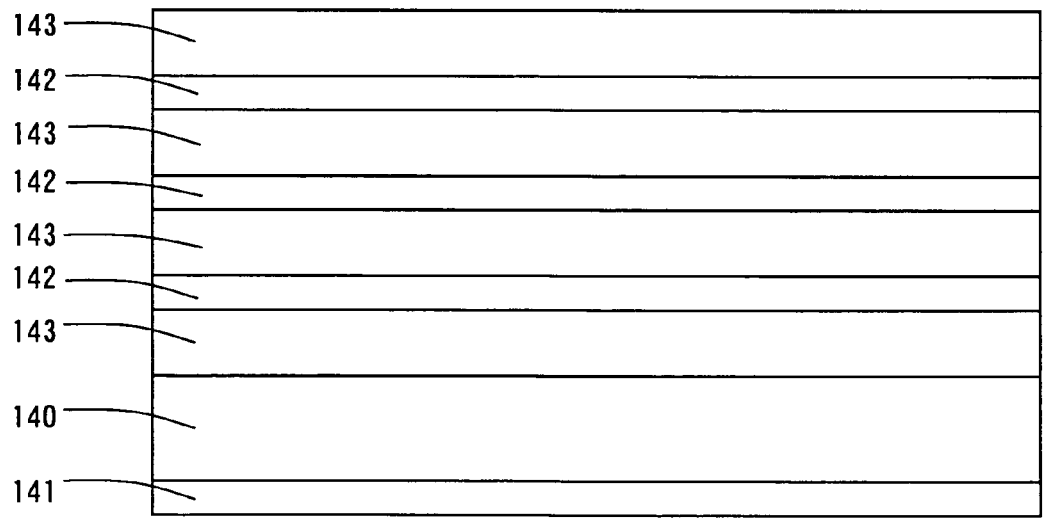

As shown in FIG. 4(a), on the (0001) plane of an n-type substrate 101 made of GaN doped with O (oxygen), an n-type layer 102, an n-type cladding layer 103, an optical guide/active layer 104, an optical guide layer 144, a cap layer 145, a p-type cladding layer 105, and a contact layer 106 are grown in this order as semiconductor layers having a laminated structure. Each of the layers is formed by, e.g., organo metallic vapor phase epitaxy (MOVPE).

As shown in FIG. 4(b), the optical guide/active layer 104 includes a carrier blocking layer 141 and an optical guide layer 140 in this order on the n-type cladding layer 103, and includes an alternate lamination of four barrier layers 143 and three well layers 142 on the optical guide layer 140.

The n-type substrate 101 has a carrier concentration of about $5\times10^{18}$ cm$^{-3}$ and a thickness of about 100 μm.

The n-type layer 102 is made of 100-nm thick GaN doped with $5\times10^{18}$ cm$^{-3}$ Si.

The n-type cladding layer 103 is made of 400-nm thick $Al_{0.07}Ga_{0.93}N$ doped with $5\times10^{18}$ cm$^{-3}$ Si. The n-type cladding layer 103 has a carrier concentration of $5\times10^{18}$ cm$^{-3}$.

The carrier blocking layer 141 is made of 5-nm thick $Al_{0.16}Ga_{0.84}N$ doped with $5\times10^{18}$ cm$^{-3}$ Si. The carrier blocking layer 141 has a carrier concentration of $5\times10^{18}$ cm$^{-3}$.

The optical guide layer 140 is made of 100-nm thick GaN doped with $5\times10^{18}$ cm$^{-3}$ Si. The optical guide layer 140 has a carrier concentration of $5\times10^{18}$ cm$^{-3}$.

Each of the well layers 142 is made of 3-nm thick undoped $In_{0.15}Ga_{0.85}N$.

Each of the barrier layers 143 is made of 20-nm thick undoped $In_{0.02}Ga_{0.98}N$.

The optical guide layer 144 is made of 10-nm thick GaN doped with $4\times10^{19}$ cm$^{-3}$ Mg. The optical guide layer 144 has a carrier concentration of about $5\times10^{17}$ cm$^{-3}$.

The cap layer 145 is made of 200-nm thick $Al_{0.16}Ga_{0.84}N$ doped with $4\times10^{19}$ cm$^{-3}$ Mg. The cap layer 145 has a carrier concentration of about $5\times10^{17}$ cm$^{-3}$.

The p-type cladding layer 105 is made of 400-nm thick $Al_{0.07}Ga_{0.93}N$ doped with $4\times10^{19}$ cm$^{-3}$ Mg. The p-type cladding layer 105 has a carrier concentration of $5\times10^{17}$ cm$^{-3}$.

The contact layer 106 is made of 10-nm thick $In_{0.02}Ga_{0.98}N$ doped with $4\times10^{19}$ cm$^{-3}$ Mg. The contact layer 106 has a carrier concentration of about $5\times10^{17}$ cm$^{-3}$.

Figure 5:
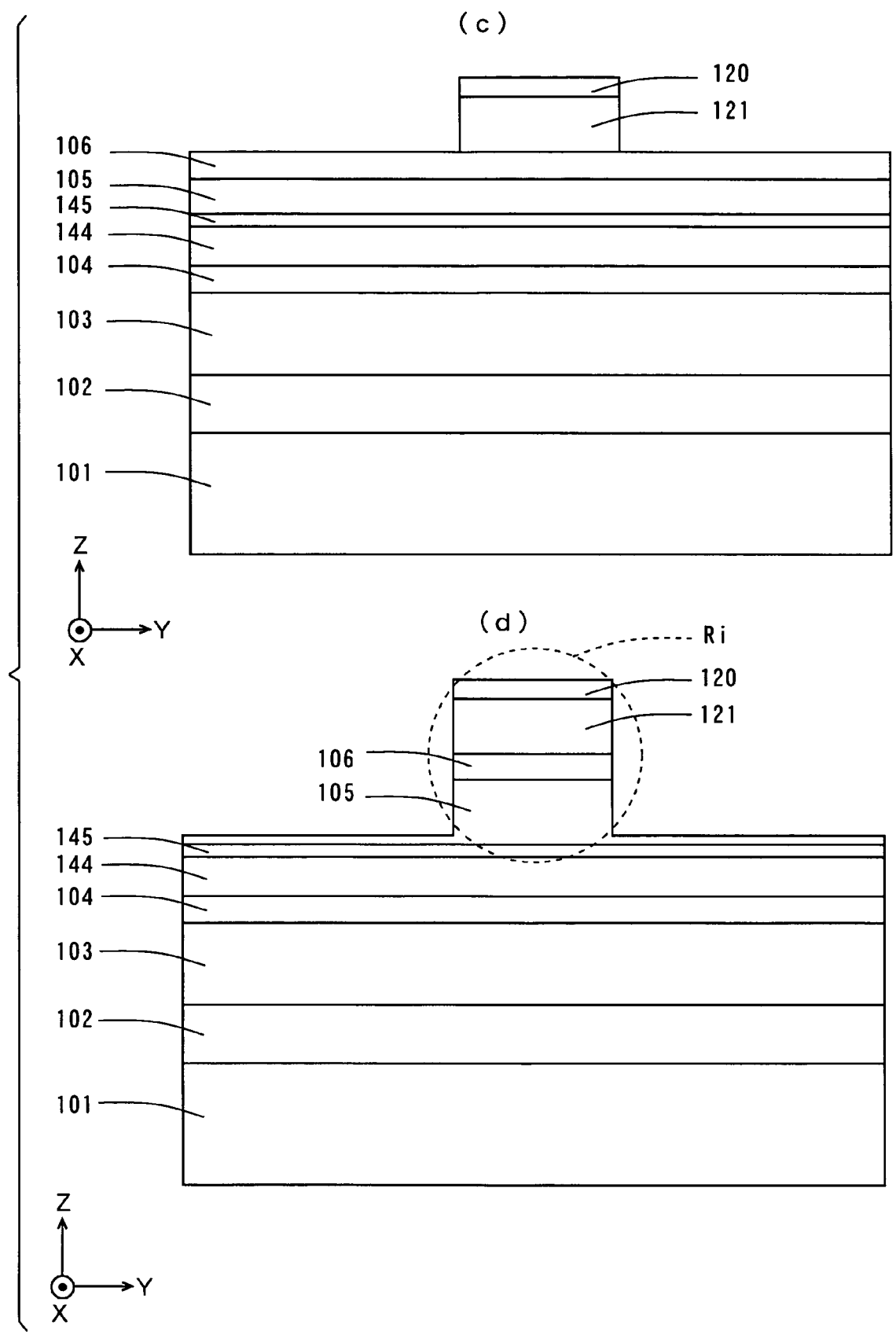
FIGS. 5(c) and 5(d) are cross sections for illustrating the manufacturing method and the structure of a blue-violet semiconductor laser device in detail.

The laminate in FIG. 4(a) is annealed at 800° C. in a $N_2$ atmosphere. Then, as shown in FIG. 5(c), a p-side ohmic electrode 121 and a $SiO_2$ mask 120 are patterned in this order on the contact layer 106.

The p-side ohmic electrode 121 is formed by laminating Pt, Pd, and Au in this order on the contact layer 106. Pt, Pd, and Au are 5 nm, 100 nm, and 150 nm, respectively, in thickness. The $SiO_2$ mask 120 is 250 nm in thickness.

Next, the laminate is subjected to dry etching at a temperature of about 200° C. using a $Cl_2$-based gas. Portions of the contact layer 106 and the p-type cladding layer 105 are thus etched to form a ridge portion Ri, as shown in FIG. 5(d).

The ridge portion Ri has a width of, e.g., 1.5 μm (in the Y direction) and a height of, e.g., 380 nm (in the Z direction).

The active layer is then subjected to etching. Predetermined portions of the optical guide/active layer 104, optical guide layer 144, cap layer 145, and p-type cladding layer 105 on the n-type cladding layer 103 are thus etched, as shown in FIG. 6(e).

An insulating film 4 is subsequently formed on an upper surface of the laminate in FIG. 6(e). The insulating film 4 is made of SiN. The insulating film 4 is 250 nm in thickness. At this point, only the $SiO_2$ mask 120 and the insulating film 4 formed on the p-side ohmic electrode 121 are removed by etching, as shown in FIG. 6(f).

Figure 6:
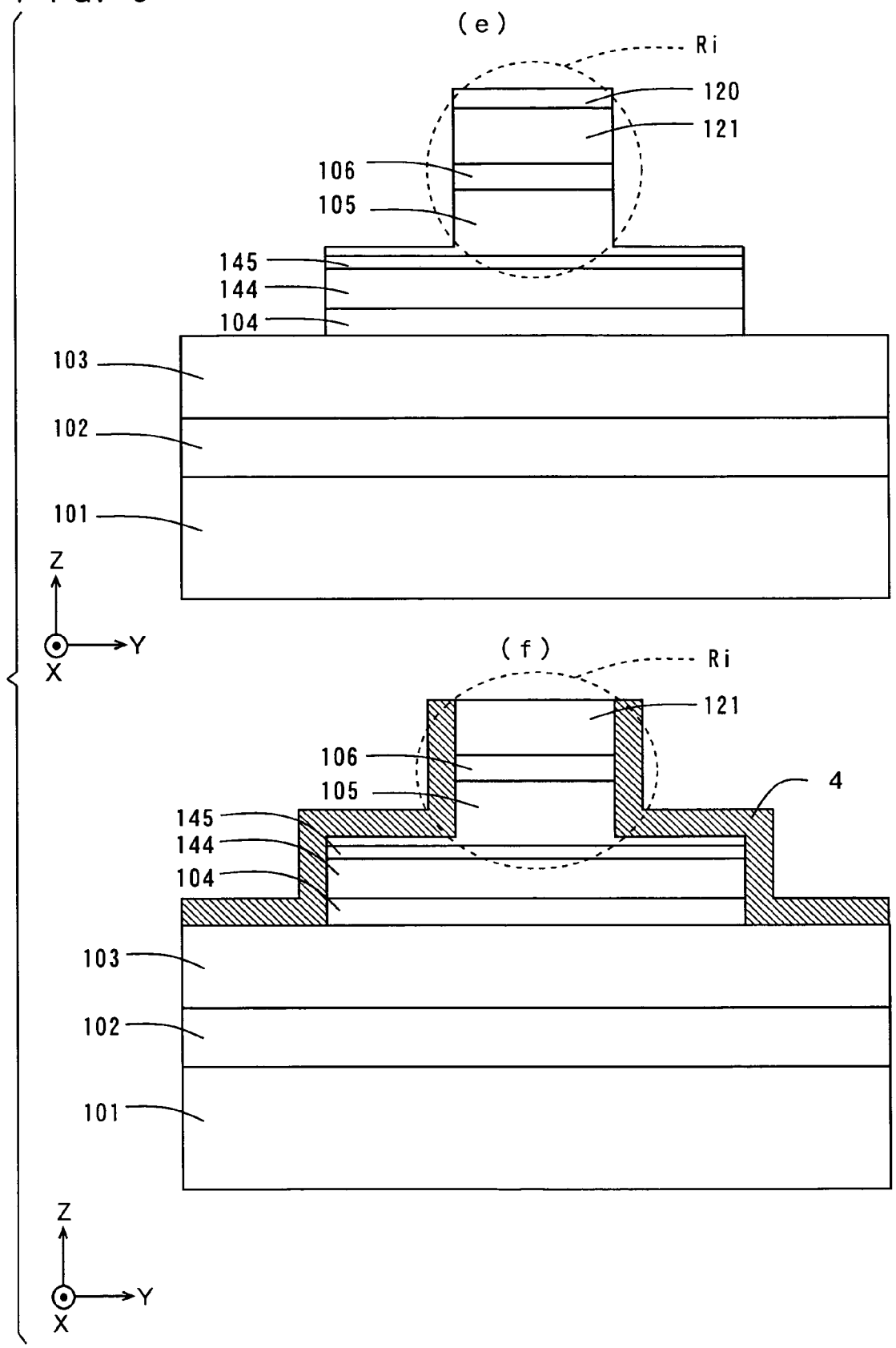
FIGS. 6(e) and 6(f) are cross sections for illustrating the manufacturing method and the structure of a blue-violet semiconductor laser device in detail.
Figure 7:
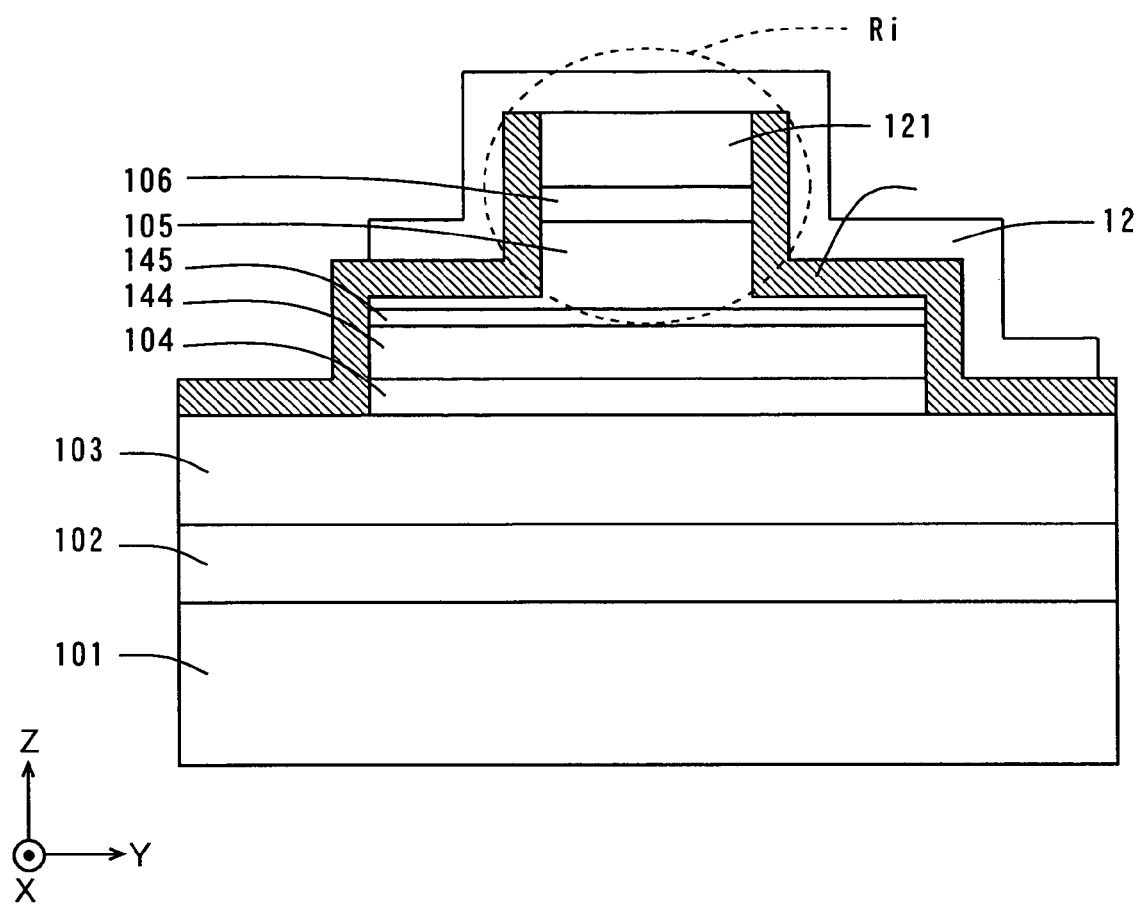
FIG. 7(g) is a cross section for illustrating the manufacturing method and the structure of a blue-violet semiconductor laser device in detail.

Then, as shown in FIG. 7(g), a p-side pad electrode 12 is formed on the p-side ohmic electrode 121 and a predetermined region of the insulating film 4, so as to cover an upper surface of the p-side ohmic electrode 121 of the laminate in FIG. 6(f).

The p-side pad electrode 12 is formed by laminating Ti, Pd, and Au in this order on the p-side ohmic electrode 121 and the insulating film 4. Ti, Pd, and Au are 100 nm, 100 nm, and 3000 nm, respectively, in thickness. A p-side pad electrode may be provided on the insulating film 4, when necessary.

Lastly, the n-type substrate 101 is grinded to a thickness of about 100 μm, and an n-electrode 15 is formed on a lower surface of the grinded n-type substrate 101.

The n-electrode 15 is formed by laminating Al, Pt, and Au in this order under the n-type substrate 101. Al, Pt, and Au are 10 nm, 20 nm, and 300 nm, respectively, in thickness.

In this embodiment, the blue-violet semiconductor laser device 1 is cleaved through a surface vertical (in the Y-Z plane) to the direction of the ridge portion Ri (in the X direction) to have a length (in the X direction) of 600 µm.

Then, a dielectric multiple film with 5% reflectivity is formed on the first facet of the resultant blue-violet semiconductor laser device 1, and a dielectric multiple film with 95% reflectivity is formed on the second facet thereof. The blue-violet semiconductor laser device 1 is subsequently separated into pieces with a width (in the Y direction) of 1 mm.

FIG. 8(h) shows a detailed cross section of a blue-violet semiconductor laser device 1 manufactured in the embodiment. In FIG. 8(h), p-side pad electrodes 13, 14 are formed on the insulating film 4 away from the p-side pad electrode 12.

With the blue-violet semiconductor laser device 1 in FIG. 8(h), the width X of the blue-violet semiconductor laser device 1 is 1 mm, the width W of the ridge portion Ri is 1.6 µm, and the width B of the p-side pad electrode 12 is 125 µm.

In addition, the width D of the optical guide layer 144, cap layer 145, and p-type cladding layer 105 after the etching described with FIG. 6(e) is 4.5 µm, and the sum t of the thicknesses of the optical guide layer 144, cap layer 145, and p-type cladding layer 105 on the sides of the ridge portion Ri is 0.2 µm.

FIGS. 9(a), 9(b), FIGS. 10(c), 10(d), and FIG. 11(e) are cross sections for illustrating the manufacturing method and the structure of the red semiconductor laser device 2 in detail.

Figure 9:
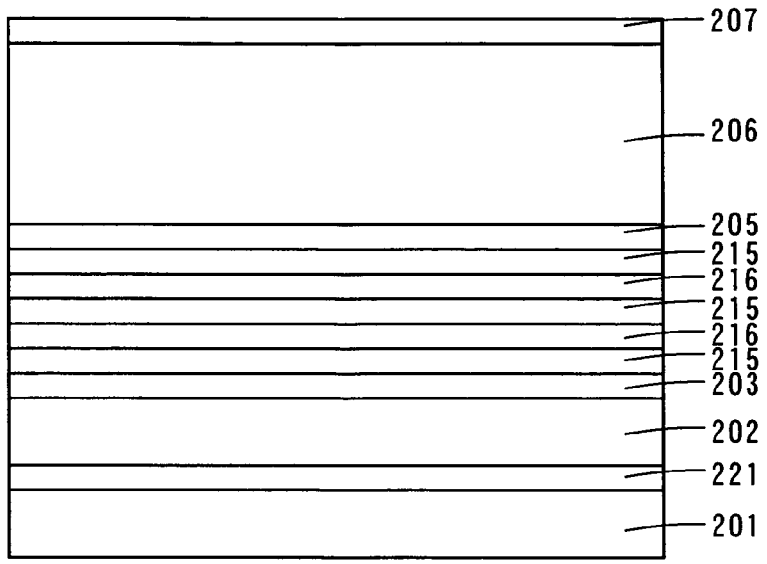
FIGS. 9(a) and 9(b) are cross sections for illustrating the manufacturing method and the structure of a red semiconductor laser device in detail.
Figure 9:
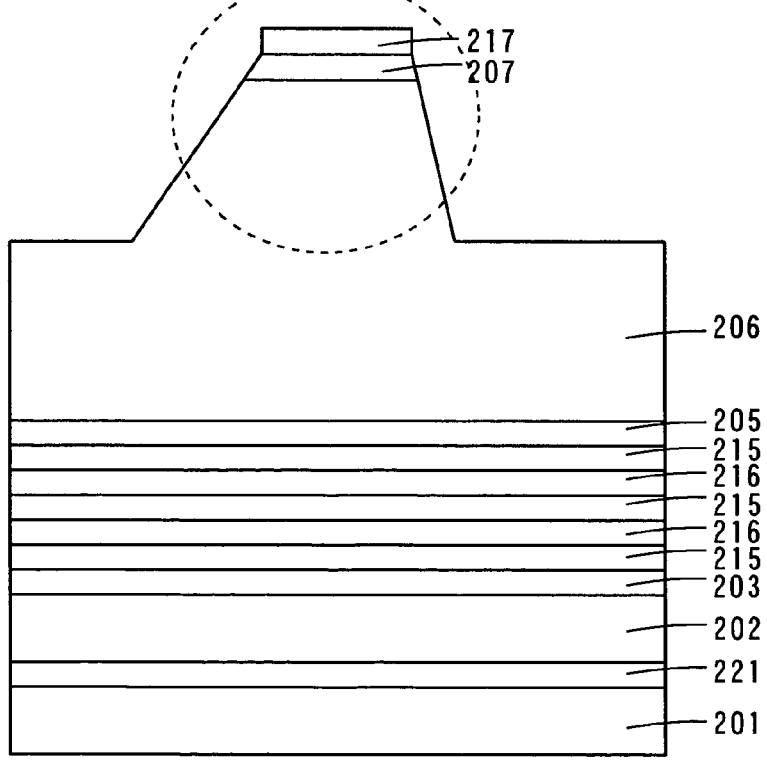

As shown in FIG. 9(a), on the (001) plane of an n-type substrate 201 made of GaAs doped with Si, an n-type layer 221, an n-type cladding layer 202, an optical guide layer 203, well layers 215, barrier layers 216, an optical guide layer 205, a p-type cladding layer 206, and a contact layer 207 are crystal-grown in this order as semiconductor layers having a laminated structure. Each of these layers is formed by, e.g., MOVPE. Note that the three well layers 215 and the two barrier layers 216 are alternately laminated on the optical guide layer 203.

The n-type substrate 201 is a substrate misoriented by seven degrees from the (001) plane. The n-type substrate 201 has a carrier concentration of about $1 \times 10^{18}$ cm$^{-3}$, and a thickness of about 100 µm.

The n-type layer 221 is made of 100-nm thick GaAs doped with $3 \times 10^{18}$ cm$^{-3}$ Si.

The n-type cladding layer 202 is made of 400-nm thick $(Al_{0.7}Ga_{0.3})_{0.5}In_{0.5}P$ doped with Si. The n-type cladding layer 202 has a carrier concentration of $3 \times 10^{17}$ cm$^{-3}$.

The optical guide layer 203 is made of 30-nm thick undoped $(Al_{0.5}Ga_{0.5})_{0.5}In_{0.5}P$.

The well layers 215 are each made of 5-nm thick undoped $Ga_{0.5}In_{0.5}P$.

The barrier layers 216 are each made of 5-nm thick undoped $(Al_{0.5}Ga_{0.5})_{0.5}In_{0.5}P$.

The optical guide layer 205 is made of 30-nm thick undoped $(Al_{0.5}Ga_{0.5})_{0.5}In_{0.5}P$.

The p-type cladding layer 206 is made of 1500-nm thick $(Al_{0.7}Ga_{0.3})_{0.5}In_{0.5}P$ doped with Zn. The p-cladding layer 206 has a carrier concentration of about $3 \times 10^{17}$ cm$^{-3}$.

The contact layer 207 is made of 200-nm thick $Ga_{0.5}In_{0.5}P$ doped with Zn. The contact layer 207 has a carrier concentration of about $2 \times 10^{18}$ cm$^{-3}$.

Next, as shown in FIG. 9(b), a SiN mask 217 is formed on a predetermined region of the contact layer 207, and then the contact layer 207 and the p-type cladding layer 206 are selectively etched. A ridge portion Ri is thus formed.

Figure 10:
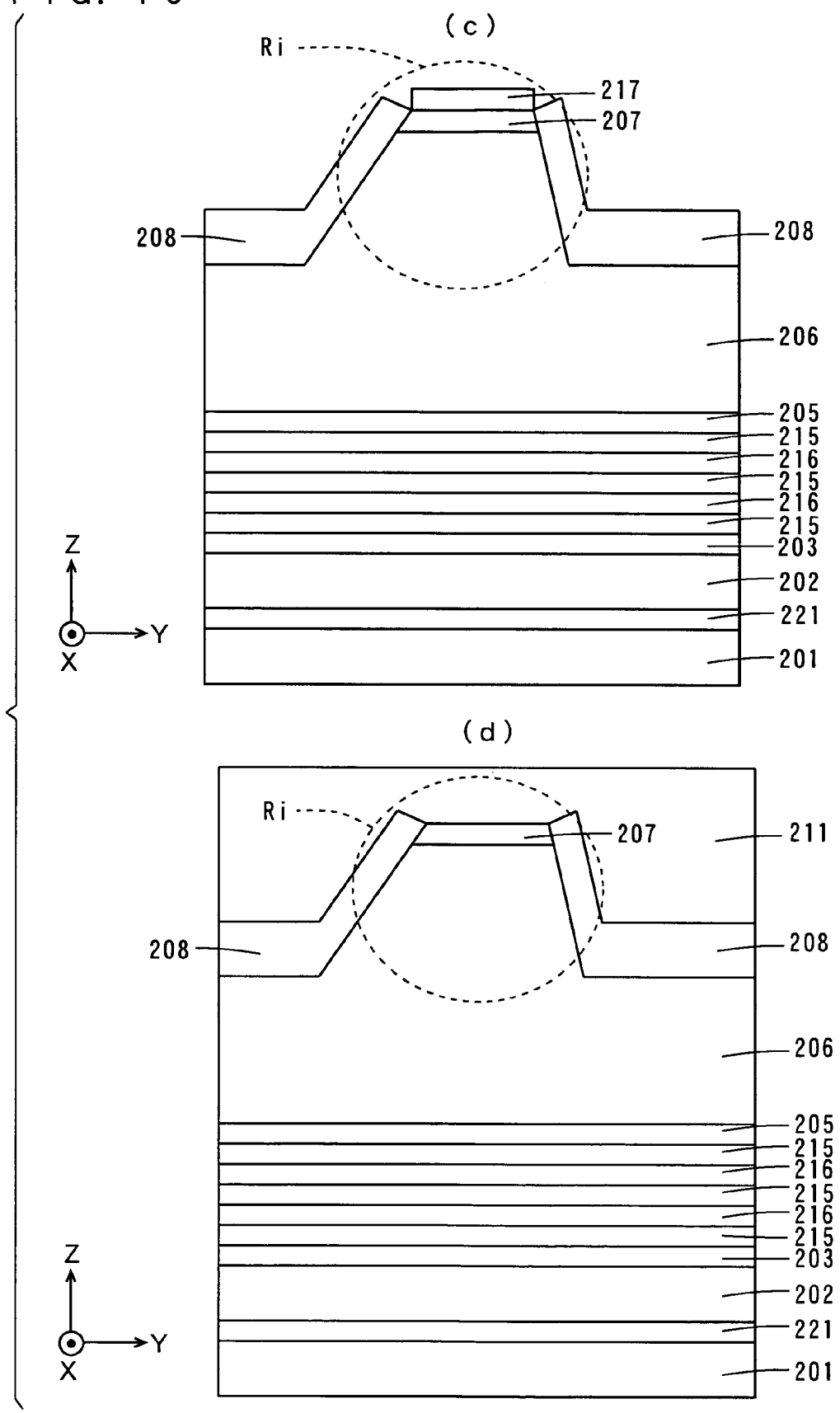
FIGS. 10(c) and 10(d) are cross sections for illustrating the manufacturing method and the structure of a red semiconductor laser device in detail.

Then, as shown in FIG. 10(c), a current blocking layer 208 is selectively grown so as to cover an upper surface and side surfaces of the etched p-type cladding layer 206 as well as side surfaces of the etched contact layer 207.

The current blocking layer 208 is made of AlGaAs doped with Si. The current blocking layer 208 has a carrier concentration of about $8 \times 10^{17}$ cm$^{-3}$.

After this, as shown in FIG. 10(d), the SiN mask 217 on the contact layer 207 is removed, and then a contact layer 211 is crystal-grown on the current blocking layer 208 and the contact layer 207.

The contact layer 211 is made of 3000-nm thick GaAs doped with Zn. The contact layer 211 has a carrier concentration of about $3 \times 10^{19}$ cm$^{-3}$.

Figure 11:
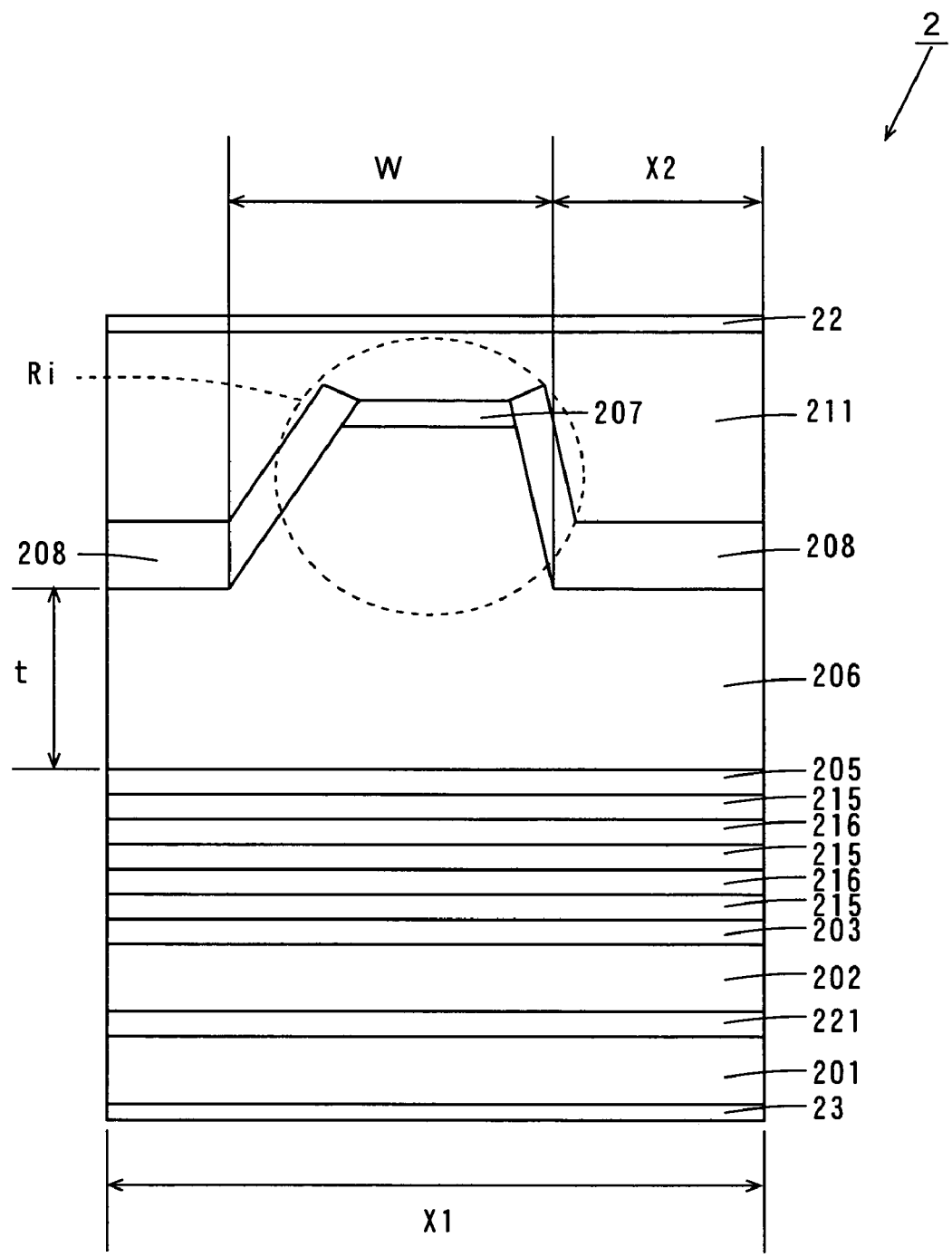
FIG. 11(e) is a cross section for illustrating the manufacturing method and the structure of a red semiconductor laser device in detail.

Lastly, as shown in FIG. 11(e), a p-electrode 22 is formed on the contact layer 211. Also, the n-type substrate 201 is grinded to a thickness of about 100 µm, and then an n-electrode 23 is formed on a lower surface of the grinded n-type substrate 201.

The p-electrode 22 is formed by laminating AuGe and Au in this order on the contact layer 211. AuGe and Au are 100 nm and 3000 nm, respectively, in thickness.

The n-electrode 23 is formed by laminating Cr and Au in this order under the n-type substrate 201. Cr and Au are 100 nm and 300 nm, respectively, in thickness.

In this embodiment, the red semiconductor laser device 2 is cleaved through a surface vertical (in the Y-Z plane) to the direction of the ridge portion Ri (in the X direction) to have a length (in the X direction) of 1200 µm.

Then, a dielectric multiple film with 5% reflectivity is formed on the first facet of the resultant red semiconductor laser device 2, and a dielectric multiple film with 95% reflectivity is formed on the second facet thereof. The red semiconductor laser device 2 is subsequently separated into pieces with a width (in the Y direction) of 250 µm.

With the red semiconductor laser device 2 in FIG. 11(e), the width X1 of the red semiconductor laser device 2 is 250 µm, the width W of the ridge portion Ri is 2.5 µm, and the width X2 between a side of the ridge portion Ri and a side surface of the red semiconductor laser device 2 in the Y direction is 50 µm. In addition, the minimum thickness t of the p-type cladding layer 206 after the etching described with FIG. 9(b) is 0.15 µm.

FIGS. 12(a), 12(b), FIGS. 13(c), and 13(d) are cross sections for illustrating the manufacturing method and the structure of the infrared semiconductor laser device 3 in detail.

Figure 12:
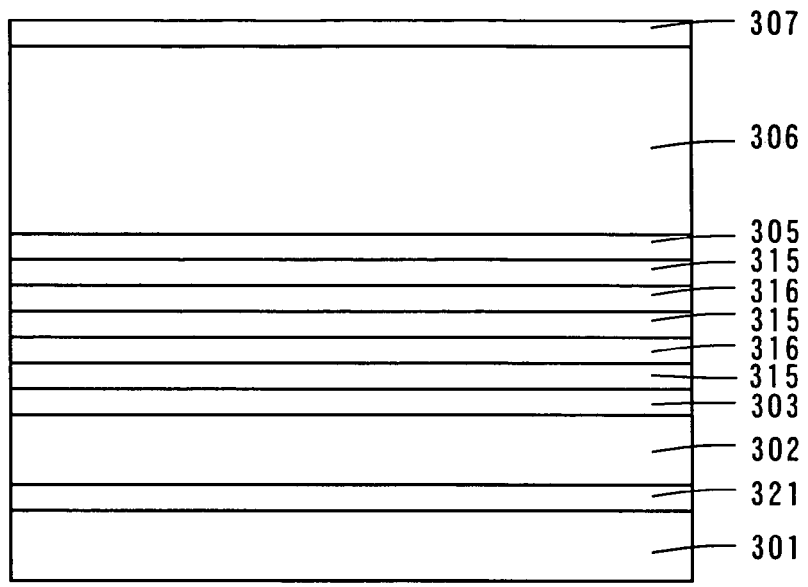
FIGS. 12(a) and 12(b) are cross sections for illustrating the manufacturing method and the structure of an infrared semiconductor laser device in detail.
Figure 12:
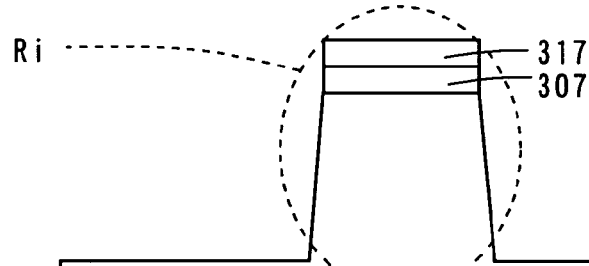
Figure 12:
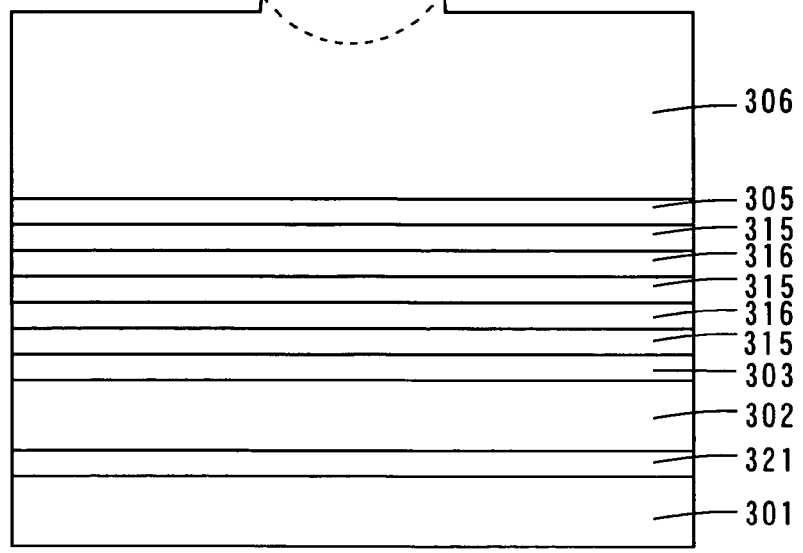

As shown in FIG. 12(a), on the (001) plane of an n-type substrate 301 made of GaAs doped with Si, an n-type layer 321, an n-type cladding layer 302, an optical guide layer 303, well layers 315, barrier layers 316, an optical guide layer 305, a p-type cladding layer 306, and a contact layer 307 are crystal-grown in this order as semiconductor layers having a laminated structure. Each of these layers is formed by, e.g., MOVPE. Note that the three well layers 315 and the two layers 316 are alternately laminated on the optical guide layer 303.

The n-type substrate 301 has a carrier concentration of about $1 \times 10^{18}$ cm$^{-3}$, and a thickness of about 100 µm.

The n-type layer 321 is made of 100-nm thick GaAs doped with $3 \times 10^{18}$ cm$^{-3}$ Si.

The n-type cladding layer 302 is made of 1500-nm thick $Al_{0.45}Ga_{0.55}As$ doped with Si. The n-type cladding layer 302 has a carrier concentration of $3 \times 10^{17}$ cm$^{-3}$.

The optical guide layer 303 is made of 30-nm thick undoped $Al_{0.35}Ga_{0.65}As$.

The well layers 315 are each made of 5-nm thick undoped $Al_{0.1}Ga_{0.9}As$.

The barrier layers 316 are each made of 5-nm thick undoped $Al_{0.35}Ga_{0.65}As$.

The optical layer 305 is made of 30-nm thick undoped $Al_{0.35}Ga_{0.65}As$.

The p-type cladding layer 306 is made of 1500-nm thick $Al_{0.45}Ga_{0.55}As$ doped with Zn. The p-type cladding layer 306 has a carrier concentration of about $3\times10^{17}$ cm$^{-3}$.

The contact layer 307 is made of 200-nm thick GaAs doped with Zn. The contact layer 307 has a carrier concentration of about $2\times10^{18}$ cm$^{-3}$.

Next, as shown in FIG. 12(b), a SiN mask 317 is formed on a predetermined region of the contact layer 307, and then the contact layer 307 and the p-type cladding layer 306 are selectively etched. A ridge portion Ri is thus formed.

Figure 13:
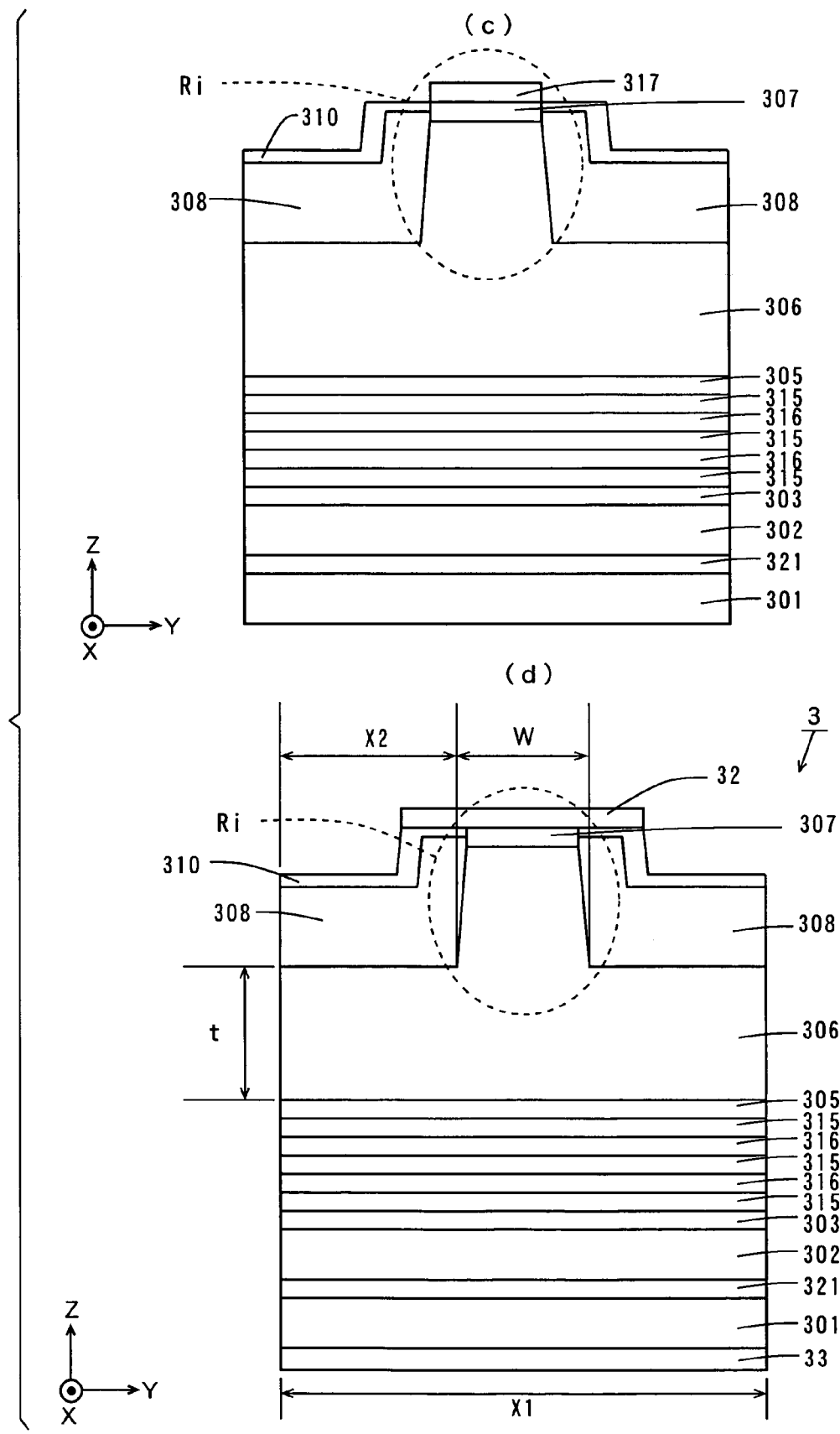
FIGS. 13(c) and 13(d) are cross sections for illustrating the manufacturing method and the structure of an infrared semiconductor laser device in detail.

Then, as shown in FIG. 13(c), a current blocking layer 308 and a cap layer 310 are selectively grown in this order so as to cover an upper surface and side surfaces of the etched p-type cladding layer 306 and side surfaces of the etched contact layer 307.

The current blocking layer 308 is made of $Al_{0.8}Ga_{0.2}As$ doped with Si. The current blocking layer 308 has a carrier concentration of about $8\times10^{17}$ cm$^{-3}$. The cap layer 310 is made of 100-nm thick undoped GaAs.

After this, as shown in FIG. 13(d), the SiN mask 317 on the contact layer 307 is removed, and subsequently, a p-electrode 32 is formed on the cap layer 310 and the contact layer 307. Also, the n-type substrate 301 is grinded to a thickness of about 100 μm, and an n-electrode 33 is formed on a lower surface of the grinded n-type substrate 301.

The p-electrode 32 is formed by laminating AuGe and Au in this order on the cap layer 310 and the contact layer 307. AuGe and Au are 100 nm and 3000 nm, respectively, in thickness.

The n-electrode 33 is formed by laminating Cr and Au in this order under the n-type substrate 301. Cr and Au are 100 nm and 300 nm, respectively, in thickness.

In this embodiment, the infrared semiconductor laser device 3 is cleaved through a surface vertical (in the Y-Z plane) to the direction of the ridge portion Ri (in the X direction) to have a length (in the X direction) of 800 μm.

Then, a dielectric multiple film with 5% reflectivity is formed on the first facet of the resultant infrared semiconductor laser device 3 and a dielectric multiple film with 95% reflectivity is formed on the second facet thereof. The infrared semiconductor laser device 3 is subsequently separated into pieces with a width (in the Y direction) of 250 μm.

With the infrared semiconductor laser device 3 of FIG. 13(d), the width X1 of the infrared semiconductor laser device 3 is 250 μm, the width W of the ridge portion Ri is 2.5 μm, and the width X2 between a side of the ridge portion Ri and a side surface of the infrared semiconductor laser device 3 in the Y direction is 50 μm. In addition, the minimum thickness t of the p-type cladding layer 306 after the etching described with FIG. 12(b) is 0.15 μm.

In the one-chip semiconductor laser device 1000 of this embodiment, the n-type substrate 101 made of GaN is used for the blue-violet semiconductor laser device 1, and the n-type substrates 201, 301 made of GaAs are used for the red semiconductor laser device 2 and the infrared semiconductor laser device 3, respectively.

In this case, since GaN is chemically stable, it is difficult to process by etching. Also, GaN is a hexagonal material, so that when forming the facets of the blue-violet semiconductor laser device 1 vertical to the X direction by cleavage, it is difficult to form side surfaces of the blue-violet semiconductor laser device 1 parallel to the X direction by cleavage. It is thus not easy to make the width of the blue-violet semiconductor laser device 1 in the Y direction small.

In contrast, GaAs is easy to process by etching. Also, GaAs is a cubic material, so that when forming the facets of each of the red semiconductor laser device 2 and the infrared semiconductor laser device 3 vertical to the X direction by cleavage, it is easy to form side surfaces of each of the red semiconductor laser device 2 and the infrared semiconductor laser device 3 parallel to the X direction by cleavage. It is thus easy to make the width of each of the red semiconductor laser device 2 and the infrared semiconductor laser device 3 small.

Accordingly, the blue-violet semiconductor laser device 1, the red semiconductor laser device 2, and the infrared semiconductor laser device 3 can be readily manufactured by setting the width of the n-type substrate 101 in the blue-violet semiconductor laser device 1 greater than the width of the n-type substrate 201 in the red semiconductor laser device 2 and the width of the n-type substrate 301 in the infrared semiconductor laser device 3.

In this embodiment, the one-chip semiconductor laser device 1000 is formed by stacking the red semiconductor laser device 2 and the infrared semiconductor laser device 3 on the blue-violet semiconductor laser device 1. This allows for a small width of the one-chip semiconductor laser device 1000. As a result, the size of the semiconductor laser apparatus can be reduced.

In the first embodiment, the n-type substrate 101 in the blue-violet semiconductor laser device 1 corresponds to a first substrate, the semiconductor layers formed along the ridge portion Ri in the blue-violet semiconductor laser device 1 correspond to a first cavity, and the blue-violet semiconductor laser device 1 corresponds to a first semiconductor laser chip.

The n-type substrate 201 in the red semiconductor laser device 2 corresponds to a second substrate, the semiconductor layers formed along the ridge portion Ri in the red semiconductor laser device 2 correspond to a second cavity, and the red semiconductor laser device 2 corresponds to a second semiconductor laser chip.

The n-type substrate 301 in the infrared semiconductor laser device 3 corresponds to a third substrate, the semiconductor layers formed along the ridge portion Ri in the infrared semiconductor laser device 3 correspond to a third cavity, and the infrared semiconductor laser device 3 corresponds to a third semiconductor laser chip.

GaN corresponds to a hexagonal material and a nitride-based semiconductor, GaAs corresponds to a cubic material and a gallium arsenide-based semiconductor, the stem 500 corresponds to a base, each of the n-electrode 23 in the red semiconductor laser device 2 and the n-electrode 33 in the infrared semiconductor laser device 3 corresponds to an electrode, and each of the wires 2W, 4W corresponds to a wire.

Second Embodiment

A semiconductor laser apparatus according to a second embodiment is different from the semiconductor laser apparatus according to the first embodiment as described below.

FIG. 14 is a schematic front view of the semiconductor laser apparatus according to the second embodiment. The semiconductor laser apparatus 2000 according to this embodiment comprises an electrically conductive submount 600 in addition to the semiconductor laser apparatus 1000 according to the first embodiment. As shown in FIG. 14, the submount 600 is bonded on a stem 500, and a one-chip semiconductor laser device 1000 is bonded on the submount 600.

Figure 15:
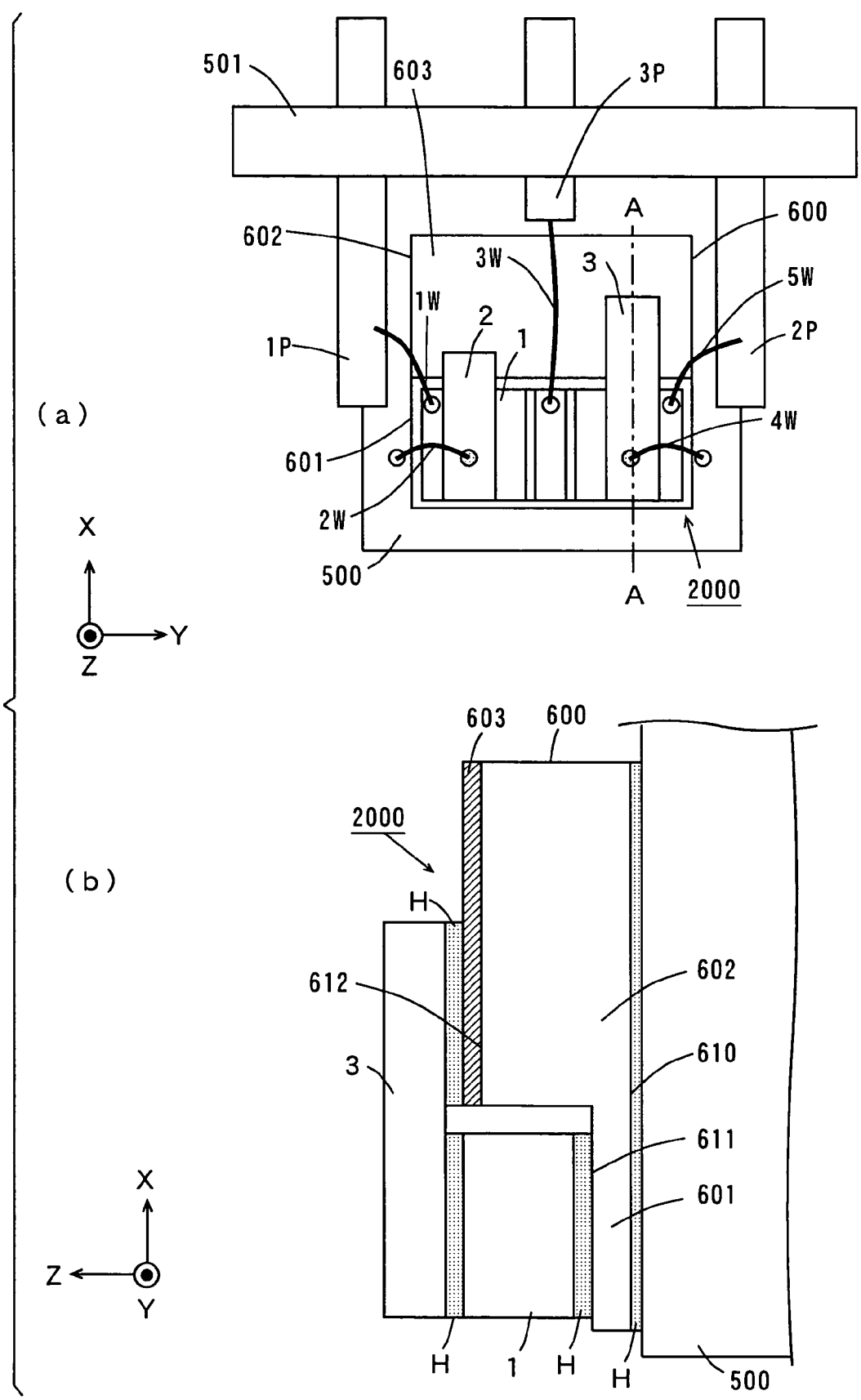
FIGS. 15(a) and 15(b) are schematic diagrams for illustrating the submount in FIG. 14 in detail.

FIG. 15 is a schematic diagram for illustrating the submount 600 in FIG. 14 in detail. FIG. 15(a) shows a magnified top view of the semiconductor laser apparatus in the second embodiment, and FIG. 15(b) shows a cross section along the line A-A in FIG. 15(a).

As shown in FIG. 15, the submount 600 comprises a lower level portion 601 and an upper level portion 602. The thickness of the upper level portion 602 (in the Z direction) is formed to be greater than that of the lower level portion 601 (in the Z direction).

The lower level portion 601 and the upper level portion 602 have a common bottom surface 610. The lower level portion 601 has an upper surface 611 parallel to the bottom surface 610, and the upper level portion 602 has an upper surface 612 parallel to the bottom surface 610. An insulating film 603 is formed on the upper surface 612.

As discussed in the first embodiment, the lengths of the red semiconductor laser device 2 and the infrared semiconductor laser device 3 (in the X direction) are longer than that of the blue-violet semiconductor laser device 1 (in the X direction) Therefore, upon bonding of the red semiconductor laser device 2 and the infrared semiconductor laser device 3 on the blue-violet semiconductor laser device 1, the red semiconductor laser device 2 and the infrared semiconductor laser device 3 project from the blue-violet semiconductor laser device 1 in the X direction.

In this embodiment, the bottom surface 610 of the submount 600 is bonded on the stem 500 through a solder film H. The blue-violet semiconductor laser device 1 is bonded on the upper surface 611 of the lower level portion 601 through a solder film H. Further, the portions of the infrared semiconductor laser device 3 and the red semiconductor laser device 2 projecting from the blue-violet semiconductor laser device 1 are bonded on the insulating film 603 on the upper level portion 602 through a solder film H.

Note that the length of the lower level portion 601 is formed to be somewhat longer than that of the blue-violet semiconductor laser device 1 (in the X direction). The length of the upper level portion 602 is formed to be longer than the lengths of the portions of the red semiconductor laser device 2 and the infrared semiconductor laser device 3 projecting from the blue-violet semiconductor laser device 1 (in the X direction) In addition, the difference between the thicknesses of the upper level portion 601 and the lower level portion 602 is almost equal to the thickness of the blue-violet semiconductor laser device 1.

In this embodiment, the upper surface 612 of the upper level portion 602 of the submount 600 is present below the portions of the red semiconductor laser device 2 and the infrared semiconductor laser device 3 projecting from above the blue-violet semiconductor laser device 1. Accordingly, the red semiconductor laser device 2 and the infrared semiconductor laser device 3 are prevented from being removed from the blue-violet semiconductor laser device 1, and also prevented from damage, even when a load is downwardly applied to the projecting portions of the red semiconductor laser device 2 and the infrared semiconductor laser device 3.

Further, the projecting portions of the red semiconductor laser device 2 and the infrared semiconductor laser device 3 are in contact with the upper surface 612 of the upper level portion 602 of the submount 600, so that heat is dissipated well from the projecting portions of the red semiconductor laser device 2 and the infrared semiconductor laser device 3. This improves the reliabilities of the red semiconductor laser device 2 and the infrared semiconductor laser device 3.

Note that in this embodiment, a stem 500 having an upper level portion and a lower level portion may be used instead of the submount 600. In that case, the blue-violet semiconductor laser device 1 is bonded on an upper surface of the lower level portion, and the portions of the red semiconductor laser device 2 and the infrared semiconductor laser device 3 projecting from the blue-violet semiconductor laser device 1 are bonded on an upper surface of the upper level portion.

In the second embodiment, the submount 600 and the stem 500 correspond to a base, the upper surface 611 of the lower level portion 601 corresponds to a lower level surface, the upper surface 612 of the upper level portion 602 corresponds to an upper level surface, and the difference in level that is formed by the lower level portion 601 and the upper level portion 602 corresponds to a difference in level.

Third Embodiment

A semiconductor laser apparatus according to a third embodiment is different from the semiconductor laser apparatus according to the first embodiment as described below.

A one-chip semiconductor laser device for use in the semiconductor laser apparatus according to the third embodiment has a structure in which a red semiconductor laser device 2 only is stacked on a blue-violet semiconductor laser device 1.

Accordingly, when mounting the one-chip semiconductor laser device on a stem 500 as with the semiconductor laser apparatus in FIG. 2, the wires 1W, 2W, 3W or the wires 3W, 4W, 5W are used.

Figure 8:
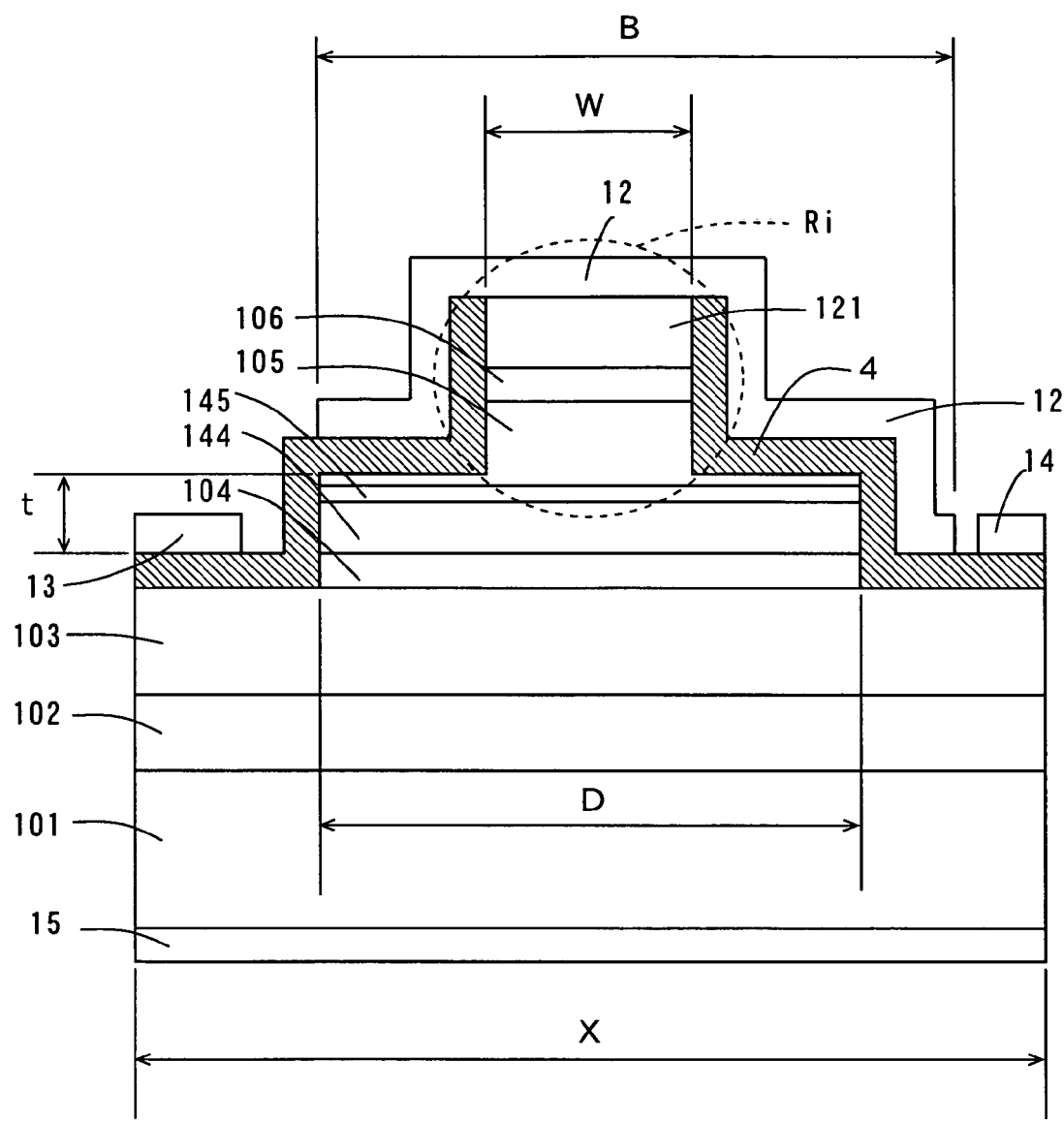
FIG. 8(h) is a cross section for illustrating the manufacturing method and the structure of a blue-violet semiconductor laser device in detail.

Regarding the shape of the blue-violet semiconductor laser device 1, the width X of the blue-violet semiconductor laser device 1 and the width B of a p-side pad electrode 12 are different from those of the blue-violet semiconductor laser device 1 in FIG. 8. In this embodiment, the width X of the blue-violet semiconductor laser device 1 is 400 μm, and the width B of the p-side pad electrode 12 is 100 μm.

Now, the manufacturing method of the one-chip semiconductor laser device for use in the semiconductor laser apparatus according to the embodiment is described.

Semiconductor layers are first formed on one surface of a GaN wafer for use as the n-type substrate 101 in the blue-violet semiconductor laser device 1, as described in the first embodiment. Then, p-side pad electrodes 12, 13 are selectively formed on a predetermined region of the semiconductor layers formed. An n-electrode 15 is formed on the other surface of the GaN wafer.

After this, semiconductor layers are formed on one surface of a GaAs wafer for use as the n-type substrate 201 in the red semiconductor laser device 2, as described in the first embodiment. A p-electrode 22 is then formed on the semiconductor layers formed, and an n-electrode 23 is selectively formed on a predetermined region of the other surface of the GaAs wafer.

Figure 16:
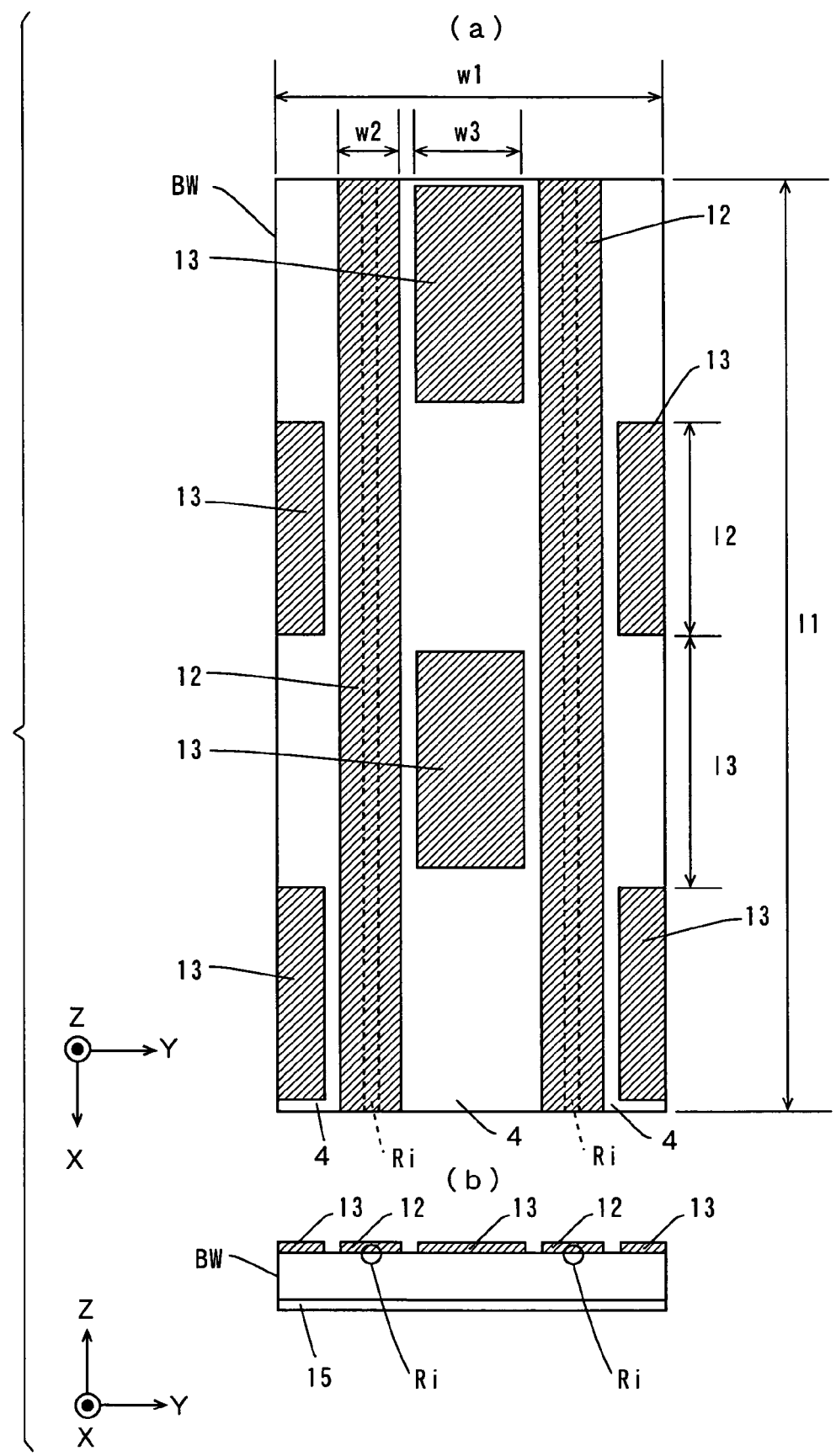
FIGS. 16(a) and 16(b) are schematic diagrams showing a GaN wafer having semiconductor layers, p-side pad electrodes, and an n-electrode formed thereon.

FIG. 16 is a schematic diagram showing the GaN wafer having the semiconductor layers, p-side pad electrodes 12, 13, and n-electrode 15 formed thereon.

FIG. 16(a) shows a top view of the GaN wafer BW that is seen from the p-side pad electrodes 12, 13 side. FIG. 16(b) shows a side view of the GaN wafer BW in the X direction. Note that in FIG. 16(b), ridge portions Ri are shown by the circles for easy understanding.

As shown in FIG. 16(a), the two rows of pad electrodes 12 are formed at a predetermined distance from each other on the insulating film 4 over the semiconductor layers across the entire length of the GaN wafer BW (in the X direction). The plurality of p-side pad electrodes 13 having a longitudinal direction in the X direction are formed with the p-side pad electrodes 12 therebetween.

The width w1 of the GaN wafer BW is, e.g., 800 µm, the width w2 of a p-side pad electrode 12 is, e.g., 100 µm, and the width w3 of a p-side pad electrode 13 is 280 µm. The length 11 of the GaN wafer BW is 2400 µm, the length 12 of a p-side pad electrode 13 is 580 µm, and a distance 13 between p-side pad electrodes 13 in the X direction is 620 µm.

Figure 17:
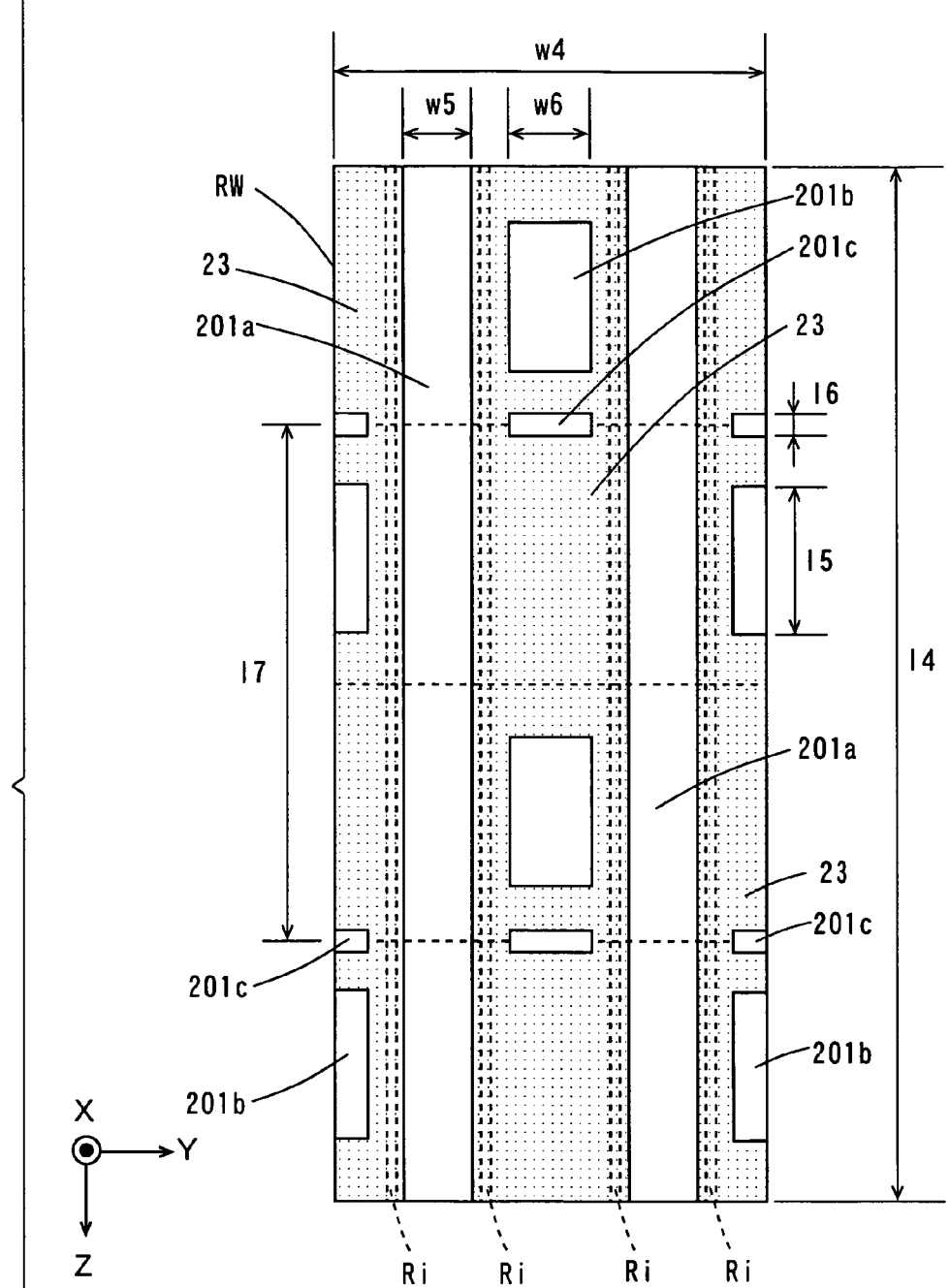
FIGS. 17(a) and 17(b) are schematic diagrams showing a GaAs wafer having semiconductor layers, a p-electrode, and n-electrodes formed thereon.
Figure 17:
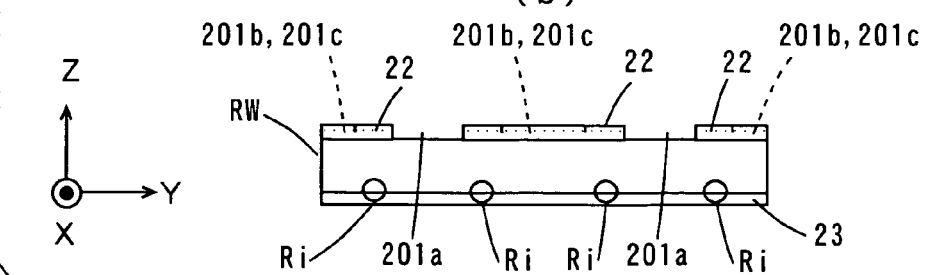

FIG. 17 is a schematic diagram showing the GaAs wafer having the semiconductor layers, p-electrode 22, and n-electrodes 23 formed thereon.

FIG. 17(a) shows a top view of the GaAs wafer RW that is seen from the n-electrodes 23 side. FIG. 17(b) shows a side view of the GaAs wafer RW in the X direction. Note that in FIG. 17(b) also, ridge portions Ri are shown by the circles for easy understanding.

As shown in FIG. 17(a), the three rows of n-electrodes 23 are formed at a predetermined distance from each other across the entire length of the GaAs wafer RW (in the X direction) on the GaAs wafer RW as the n-type substrate 201. Two rows of bare regions 201a on which n-electrodes are not formed are present between the three rows of n-electrodes 23 across the entire length of the GaAs wafer RW (in the X direction).

In each of the three rows of n-electrodes 23, bare regions 201b, 201c on which n-electrodes are not formed are present at a predetermined distance along the X direction. The non-n-electrode regions 201b have a longitudinal direction in the X direction, and the bare regions 201c have a longitudinal direction in the Y direction.

The width w4 of the GaAs wafer RW is, e.g., 800 µm, the width w5 of a bare region 201a is, e.g., 120 µm, and the width w6 of each of a bare region 201b and a bare region 201c is, e.g., 220 µm.

Further, the length 14 of the GaAs wafer RW is, e.g, 2400 µm, the length 15 of a bare region 201b is, e.g., 300 µm, the length 16 of a bare region 201c is, e.g., 20 µm, and a distance 17 between bare regions 201 in the X direction is, e.g., 1200 µm.

Next, the GaN wafer BW laminate manufactured as shown in FIG. 16 and the GaAs wafer RW laminate manufactured as shown in FIG. 17 are laminated with each other. The lamination is accomplished by forming a solder film H on the p-side pad electrodes 13 of the GaN wafer BW in FIG. 16, and then bonding the p-electrode 22 of the GaAs wafer RW on the solder film H so that the respective region portions in the GaN wafer BW and the GaAs wafer RW are aligned in parallel. In this way, the GaN wafer BW and the GaAs wafer RW are partly laminated with each other.

After this, the GaAs wafer RW is etched through the bare regions 201, 201b, 201c from the n-electrodes 23 side of the GaAs wafer RW. In this way, holes are formed that extend from the n-electrodes 23 side to the insulating film 4 and the p-side pad electrodes 12, 13 on the GaN wafer BW.

The resultant laminate of the GaN wafer BW and the GaAs wafer RW will hereinafter be referred to as a wafer laminate.

Figure 18:
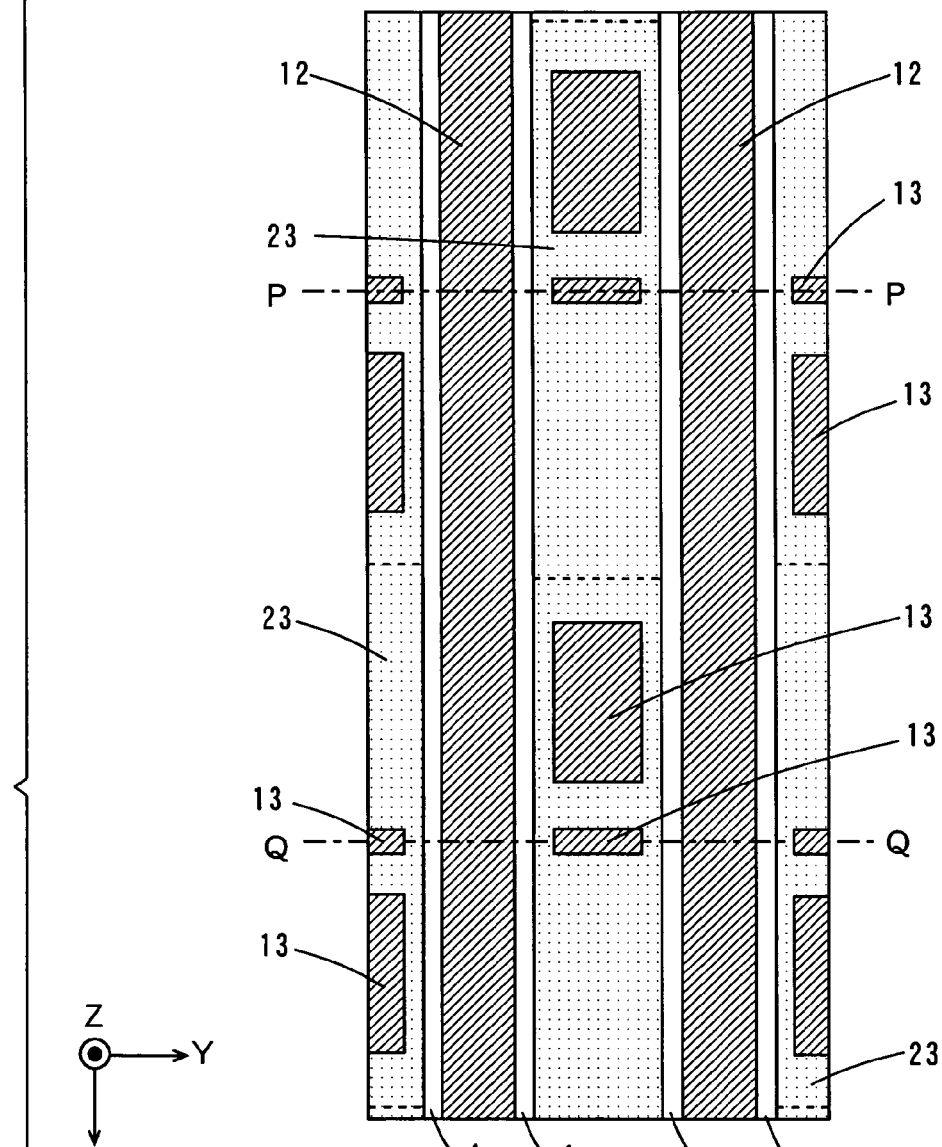
FIGS. 18(a) and 18(b) are schematic diagrams showing the GaAs wafer that has been etched after the lamination of the GaN wafer and the GaAs wafer.
Figure 18:
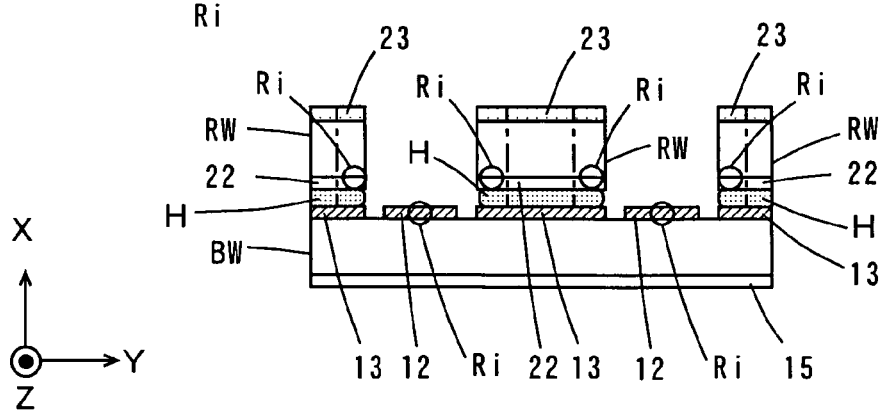

FIG. 18 is a schematic diagram showing the GaAs wafer RW that has been etched after the lamination of the GaN wafer BW and the GaAs wafer RW.

FIG. 18(a) shows a top view of the wafer laminate that is seen from the n-electrodes 23 side of the GaAs wafer RW. FIG. 18(b) shows a side view of the wafer laminate in the X direction.

As shown in FIG. 18, the p-side pad electrodes 12, 13, and the insulating film 4 on the GaN wafer BW are exposed toward the n-electrodes 23 side upon etching of the GaAs wafer RW.

Then, the etched wafer laminate is cleaved at predetermined distances in the X direction. For example, the GaN wafer BW is cleaved by forming scribe cuts along the line P-P and the line Q-Q on the GaN wafer BW in FIG. 18(a). Since the holes in the bare regions 201c (see FIG. 17(a)) are formed along the line P-P and the line Q-Q on the GaAs wafer RW, the GaAs wafer RW is easily cleaved along the line P-P and the line Q-Q while the GaN wafer BW is cleaved.

Figure 19:
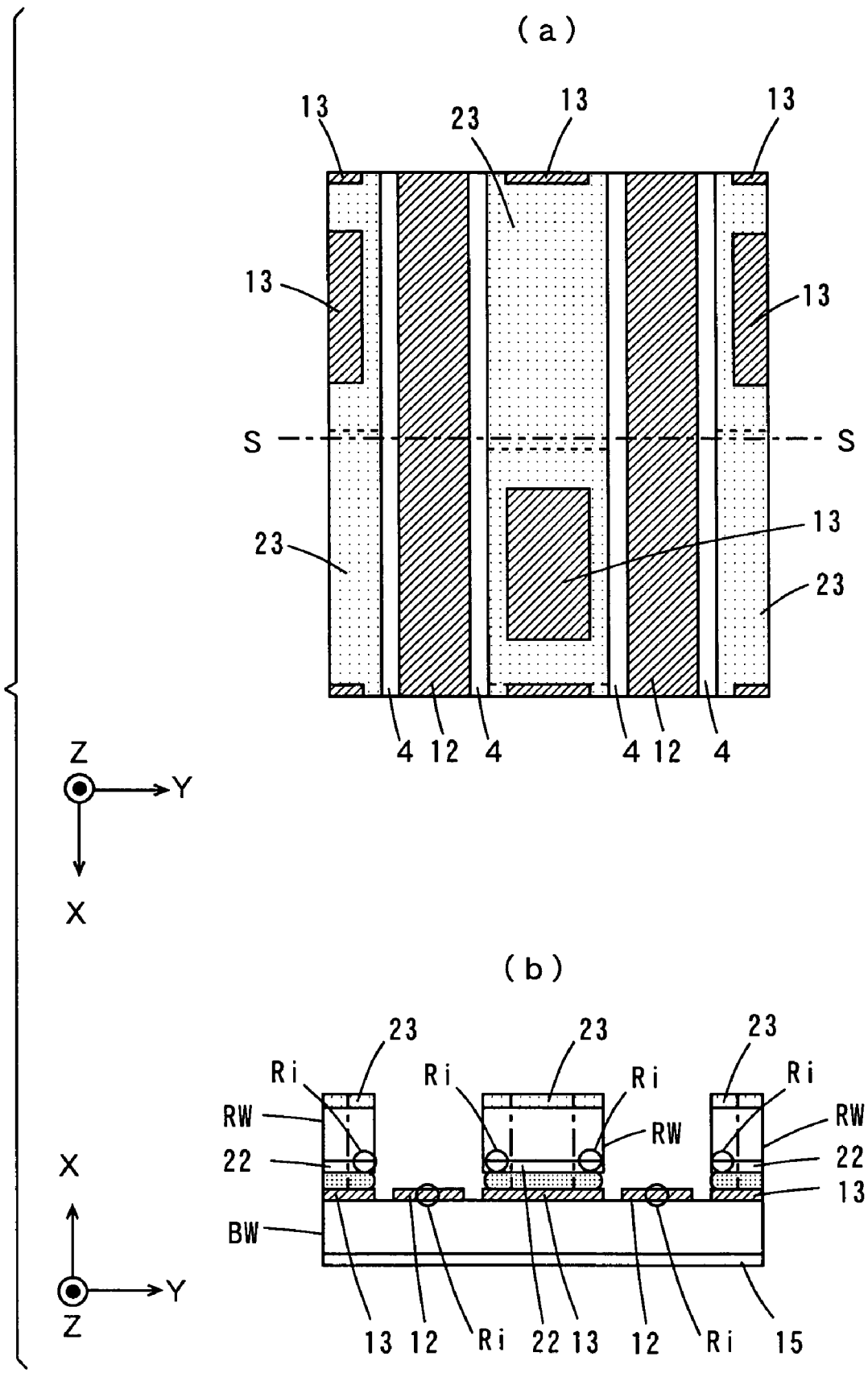
FIGS. 19(a) and 19(b) are schematic diagrams showing a wafer laminate that has been cleaved along the line P-P and the line Q-Q in FIG. 18(a)

FIG. 19 is a schematic diagram showing the wafer laminate that has been cleaved along the line P-P and the line Q-Q in FIG. 18(a).

FIG. 19(a) shows a top view of the wafer laminate cleaved along the line P-P and the line Q-Q that is seen from the n-electrodes 23 side of the GaAs wafer RW. FIG. 19(b) shows a side view of the wafer laminate in the X direction.

An additional scribe cut is formed along the line S-S in FIG. 19(a) on the GaN wafer BW, and then the GaN wafer BW is cleaved.

Figure 20:
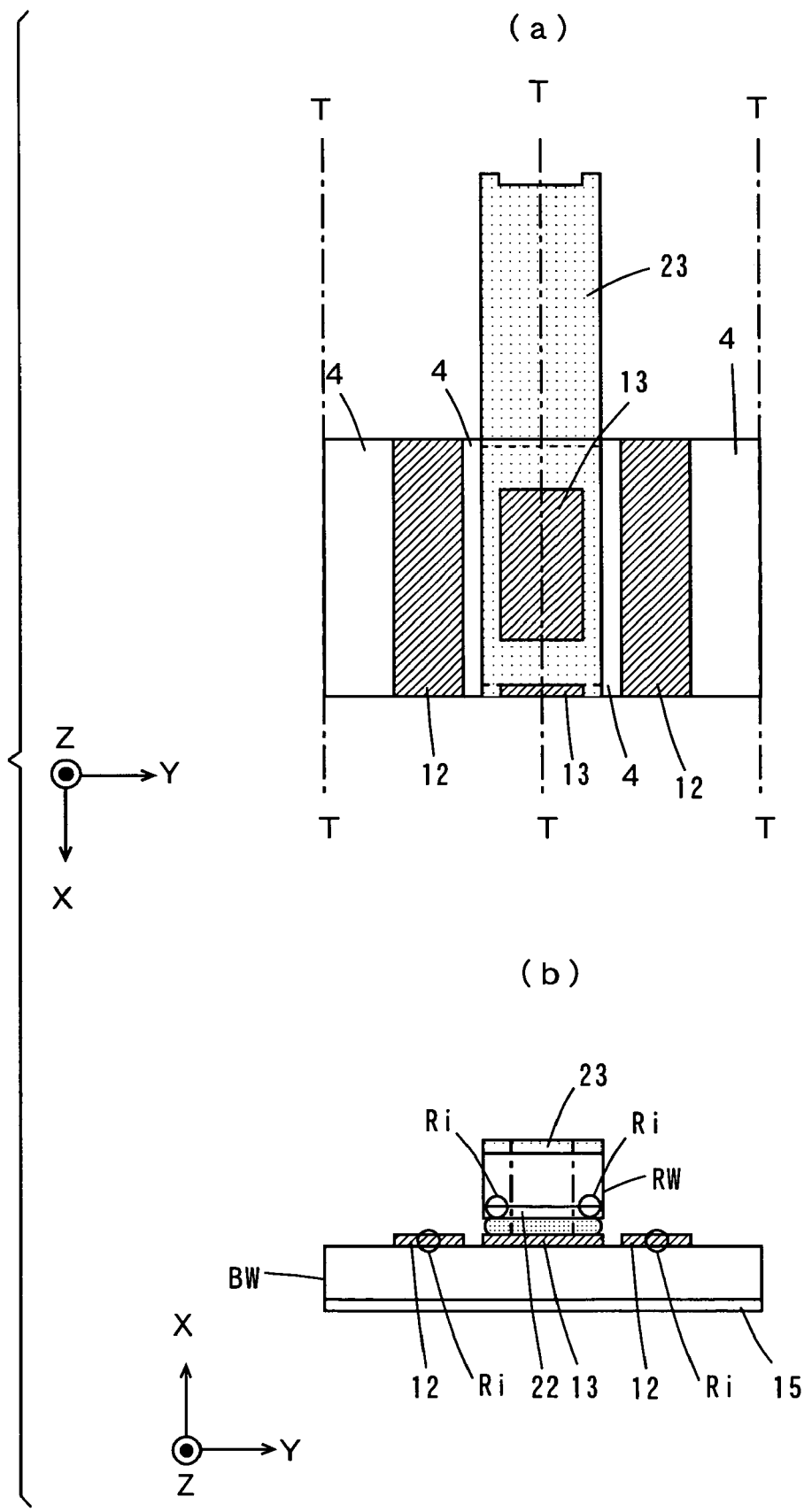
FIGS. 20(a) and 20(b) are schematic diagrams showing the wafer laminate in which only the GaN wafer has been cleaved along the line S-S in FIG. 19(a)

FIG. 20 is a schematic diagram showing the wafer laminate in which only the GaN wafer BW has been cleaved along the line S-S in FIG. 19(a).

FIG. 20 (a) shows a top view of the wafer laminate that is seen from the n-electrode 23 side of the GaAs wafer RW. FIG. 20(b) shows a side view of the wafer laminate in the X direction.

As described above, the GaN wafer BW and the GaAs wafer RW are bonded with each other through the solder film H on the p-side pad electrode 13. Accordingly, when only the GaN wafer BW is cleaved, the GaAs wafer RW is supported on the GaN wafer BW while projecting in the X direction. In this state, the wafer laminate is cleaved along the lines T-T of FIG. 20(a) in the X direction. One-chip semiconductor laser devices for use in the semiconductor laser apparatuses according to this embodiment is thus completed.

Figure 21:
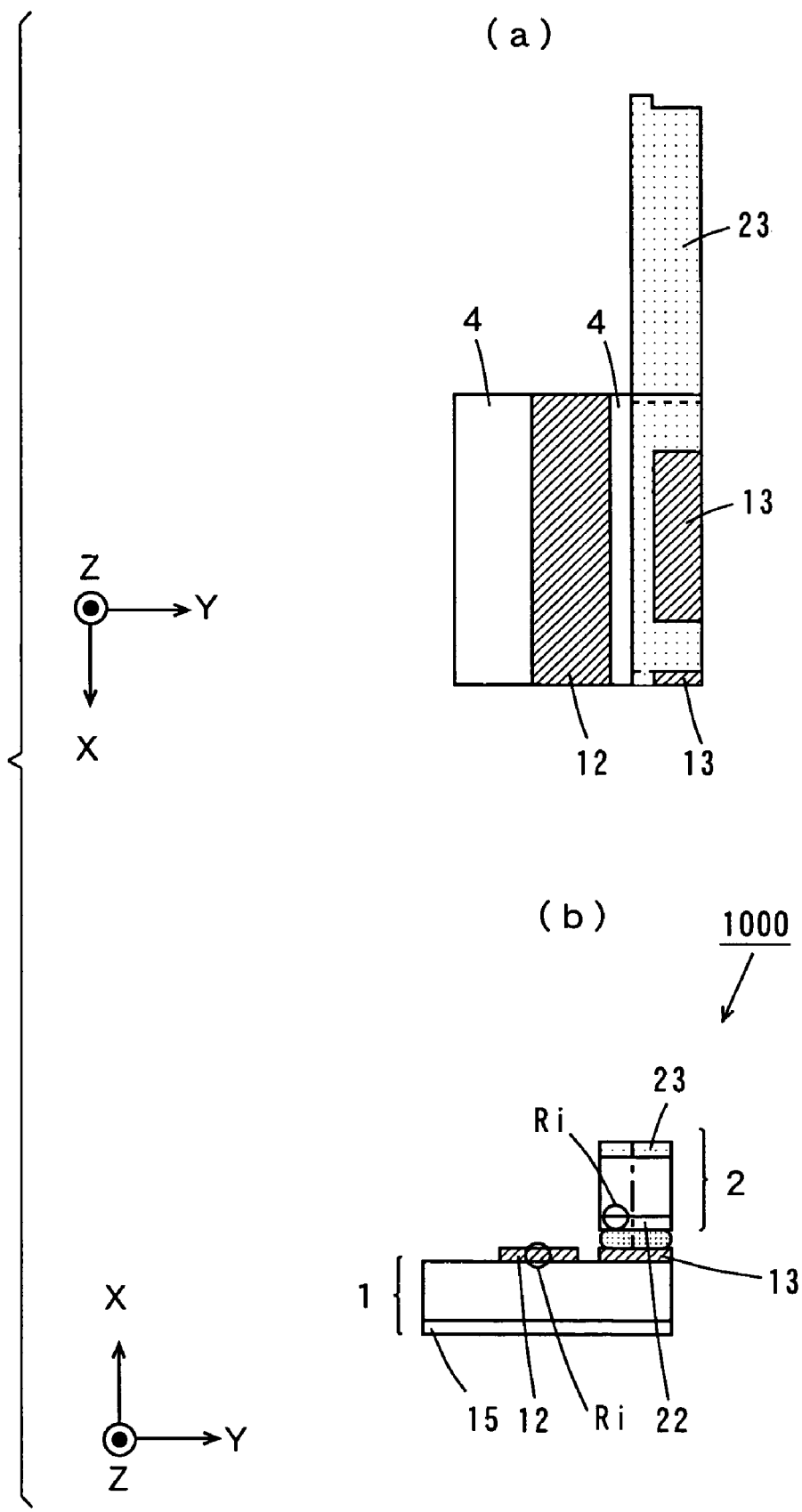
FIGS. 21(a) and 21(b) are schematic diagrams showing a one-chip semiconductor laser device for use in a semiconductor laser apparatus according to a third embodiment.

FIG. 21 is a schematic diagram showing a one-chip semiconductor laser device for use in the semiconductor laser apparatus according to the third embodiment.

FIG. 21(a) shows a top view of the one-chip semiconductor laser device 1000 that is seen from the n-electrode 23 side. FIG. 21(b) shows a side view of the one-chip semiconductor laser device 1000 in the X direction.

As described above, the semiconductor laser apparatus according to the third embodiment is completed by mounting the one-chip semiconductor laser device 1000 in FIG. 21 on the stem 500 in FIG. 2 or the submount 600 in FIG. 14.

In this embodiment, each of a plurality of blue-violet semiconductor laser devices 1 and each of a plurality of red semiconductor laser devices 2 are stacked on each other by laminating the GaN wafer BW and the GaAs wafer RW. In this case, when the GaN wafer BW and the GaAs wafer RW are positioned, the plurality of blue-violet semiconductor laser devices 1 and the red semiconductor laser devices 2 are simultaneously positioned, which improves the positioning accuracy, and reduces the time necessary for positioning. This improves the yields of semiconductor laser apparatuses while reducing the manufacturing time and cost.

After stacking the red semiconductor laser devices 2 on the blue-violet semiconductor laser devices 1, stress is generated in each of the blue-violet semiconductor laser device 1 and the red semiconductor laser device 2, attributed to the difference between the thermal expansion of each of the blue-violet semiconductor laser device 1 and the red semiconductor laser device 2 due to temperature changes. The modulus of elasticity of the GaAs wafer RW in the red semiconductor laser device 2 is smaller than that of the GaN wafer BW in the blue-violet semiconductor laser device 1. This means that the strain induced in the GaAs wafer RW due to the stress generated in the red semiconductor laser device 2 is greater than the strain induced in the GaN wafer BW due to the stress generated in the blue-violet semiconductor laser device 1.

Note, however, that the length of the red semiconductor laser device 2 is longer than the length of the blue-violet semiconductor laser device 1, so that the strain in the facet of the red semiconductor laser device 2 is reduced. This prevents deterioration of the red semiconductor laser device 2, and improves the reliability. This results in improved reliability of the semiconductor laser apparatus.

In addition, the red semiconductor laser device 2 is stacked on the blue-violet semiconductor laser device 1, so that the width of the one-chip semiconductor laser device 1000 can be made smaller. This results in a smaller size of the semiconductor laser apparatus.

Although the embodiment describes the manufacturing method of the one-chip semiconductor laser device 1000 in which the red semiconductor laser device 2 is stacked on the blue-violet semiconductor laser device 1, the manufacturing method may also be applied to a one-chip semiconductor laser device 1000 in which the infrared semiconductor laser device 3 is stacked on the blue-violet semiconductor laser device 1.

In the third embodiment, the GaN wafer BW corresponds to a first wafer, the semiconductor layers formed along the ridge portions Ri on the GaN wafer BW correspond to a first cavity, and the blue-violet semiconductor laser device 1 corresponds to a first semiconductor laser chip.

The GaAs wafer RW corresponds to a second wafer, the semiconductor layers formed along the ridge portions Ri on the GaAs wafer RW correspond to a second cavity, and the red semiconductor laser device 2 corresponds to a second semiconductor laser chip.

Although in each of the above-described first, second, and third embodiments, gallium nitride is used as the first substrate having a greater modulus of elasticity, and gallium arsenide is used as the second substrate having a smaller modulus of elasticity, sapphire may also be used as the first substrate, and a nitride-based semiconductor may be formed on the sapphire substrate. Zinc oxide may also be used as the first substrate having a greater modulus of elasticity. Sapphire may also be used as the first substrate, and a zinc oxide-based semiconductor may be formed on the sapphire substrate. Gallium phosphide, indium phosphide, or indium arsenide may also be used as the second substrate having a smaller modulus of elasticity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser apparatus comprising:
a first substrate made of a nitride-based semiconductor;
a first semiconductor laser chip including a first semiconductor layer that is formed on said first substrate and has a first cavity, a first one facet emitting a greater amount of a laser beam of said first cavity, and a first other facet emitting a smaller amount of the laser beam of said first cavity;
a second substrate made of a gallium arsenide-based semiconductor;
a second semiconductor laser chip including a second semiconductor layer that is formed on said second substrate and has a second cavity, a second one facet emitting a greater amount of a laser beam of said second cavity, and a second other facet emitting a smaller amount of the laser beam of said second cavity; and
a base, wherein
said first semiconductor layer has a first surface parallel to said first cavity on the opposite side to said first substrate,
said second semiconductor layer has a second surface parallel to said second cavity on the opposite side to said second substrate,
said base, said first semiconductor laser chip and said second semiconductor laser chip are stacked in that order, and said first cavity and said second cavity are aligned substantially parallel to each other,
the length of said second substrate and said second cavity is greater than the length of said first substrate and said first cavity,
a part of said second surface of said second semiconductor laser chip on said second one facet side is bonded to said first surface of said first semiconductor laser chip with an insulating film sandwiched therebetween, and a part of said second surface of said second semiconductor laser chip on said second other facet side projects from said first semiconductor laser chip and is not bonded to said first surface of said first semiconductor laser chip.

2. The semiconductor laser apparatus according to claim 1, wherein
the length of said second cavity is greater than the length of said first cavity by not less than the amount of the thickness of said second substrate.

3. The semiconductor laser apparatus according to claim 1, wherein
said first substrate is made of a hexagonal material,
said second substrate is made of a cubic material, and
the width of said first substrate in a width direction of said first cavity is greater than the width of said second substrate in a width direction of said second cavity.

4. The semiconductor laser apparatus according to claim 1,
said second semiconductor laser chip has an electrode on a surface thereof opposite to said first semiconductor laser chip, and
a wire is connected to a position of said electrode of said second semiconductor laser chip above said first semiconductor laser chip.

5. The semiconductor laser apparatus according to claim 1, wherein
said base has a difference in level that is formed by an upper level surface and a lower level surface,
the difference in level between said lower level surface and said upper level surface is almost equivalent to the thickness of said first semiconductor laser chip, and
said first semiconductor laser chip is provided on said lower level surface of said base, and a portion of said second semiconductor laser chip projecting from above said first semiconductor laser chip is provided on said upper level surface of said base.

6. The semiconductor laser apparatus according to claim 1, further comprising a third semiconductor laser chip that is formed on a third substrate and has a third cavity, and wherein
said second semiconductor laser chip and said third semiconductor laser chip are arranged on said first semiconductor laser chip so that said first cavity, said second cavity, and said third cavity are aligned substantially parallel to one another,
the length of said third cavity is greater than the length of said first cavity,
the modulus of elasticity of said third substrate is smaller than the modulus of elasticity of said first substrate, and
said third semiconductor laser chip is stacked on said first semiconductor laser chip.

7. The semiconductor laser apparatus according to claim 6, wherein the length of said third cavity is greater than the length of said first cavity by not less than the amount of the thickness of said third substrate.

8. The semiconductor laser apparatus according to claim 6, wherein
said first substrate is a hexagonal material,
each of said second substrate and said third substrate is made of a cubic material, and
the width of said first substrate in a direction vertical to a longitudinal direction of said first cavity is greater than the width of said second substrate in a direction vertical to a longitudinal direction of said second cavity and the width of said third substrate in a direction vertical to a longitudinal direction of said third cavity.

9. The semiconductor laser apparatus according to claim 6, each of said second semiconductor laser chip and said third semiconductor laser chip has an electrode on a surface thereof opposite to said first semiconductor laser chip, and
wires are connected to positions of said electrodes of said second semiconductor laser chip and said third semiconductor laser chip above said first semiconductor laser chip.

10. The semiconductor laser apparatus according to claim 6, wherein
said base has a difference in level that is formed by a lower level surface and an upper level surface,
the difference in level between said lower level surface and said upper level surface is almost equivalent to the thickness of said first semiconductor laser chip, and
said first semiconductor laser chip is provided on said lower level surface of said base, and a portion of each of said second semiconductor laser chip and said third semiconductor laser chip projecting from above said first semiconductor laser chip is provided on said upper level surface of said base.

11. A semiconductor laser apparatus comprising:
a first substrate made of a nitride-based semiconductor;
a first semiconductor laser chip including a first semiconductor layer that is formed on said first substrate and has a first cavity, a first one facet emitting a greater amount of a laser beam of said first cavity, and a first other facet emitting a smaller amount of the laser beam of said first cavity;
a second substrate;
a second semiconductor laser chip including a second semiconductor layer that is formed on said second substrate and has a second cavity, a second one facet emitting a greater amount of a laser beam of said second cavity, and a second other facet emitting a smaller amount of the laser beam of said second cavity, wherein
said first semiconductor layer has a first surface parallel to said first cavity on the opposite side to said first substrate,
said second semiconductor layer has a second surface parallel to said second cavity on the opposite side to said second substrate,
said first semiconductor laser chip and said second semiconductor laser chip are stacked on each other so that said first cavity and said second cavity are aligned substantially parallel to each other,
the length of said second substrate and said second cavity is greater than the length of said first substrate and said first cavity,
a part of said second surface of said second semiconductor laser chip on said second one facet side is bonded to said first surface of said first semiconductor laser chip, and a part of said second surface of said second semiconductor laser chip on said second other facet side projects from said first semiconductor laser chip and is thus not bonded to said first surface of said first semiconductor laser chip, and
the width of said first substrate in a direction perpendicular to a direction of the length of said first cavity is greater than the width of said second substrate in a direction perpendicular to a direction of the length of said second cavity,
said second semiconductor laser chip further has an electrode on a surface thereof opposite to said second surface, and
a wire is connected to said electrode of said second semiconductor laser chip in a region overlapped with a bonded portion of said first surface and said second surface.

12. The semiconductor laser apparatus according to claim 11, wherein
the length of said second cavity is greater than the length of said first cavity by not less than the amount of the thickness of said second substrate.

13. The semiconductor laser apparatus according to claim 11, further comprising a third semiconductor laser chip that is formed on a third substrate and has a third cavity, and wherein
said second semiconductor laser chip and said third semiconductor laser chip are arranged on said first semiconductor laser chip so that said first cavity, said second cavity, and said third cavity are aligned substantially parallel to one another,
the length of said third cavity is greater than the length of said first cavity, and
the modulus of elasticity of said third substrate is smaller than the modulus of elasticity of said first substrate.

14. The semiconductor laser apparatus according to claim 13, wherein the length of said third cavity is greater than the length of said first cavity by not less than the amount of the thickness of said third substrate.

15. The semiconductor laser apparatus according to claim 1, wherein said second cavity is disposed (1) inside the second semiconductor laser chip and (2) near at least the part of said second surface bonded to the first surface of the first semiconductor laser chip.

16. The semiconductor laser apparatus according to claim 5, wherein said second cavity is disposed (1) inside the second semiconductor laser chip and (2) near at least the part of said second surface bonded to the first surface of the first semiconductor laser chip.

17. A semiconductor laser apparatus comprising:
a first substrate made of a nitride-based semiconductor;
a first semiconductor laser chip including a first semiconductor layer that is formed on said first substrate and has a first cavity, a first one facet emitting a greater amount of a laser beam of said first cavity, and a first other facet emitting a smaller amount of the laser beam of said first cavity;
a second substrate made of a gallium arsenide-based semiconductor;
a second semiconductor laser chip including a second semiconductor layer that is formed on said second substrate and has a second cavity, a second one facet emitting a greater amount of a laser beam of said second cavity, and a second other facet emitting a smaller amount of the laser beam of said second cavity;
a base; and
a stem that is electrically connected to a terminal, wherein
said first semiconductor layer has a first surface parallel to said first cavity on the opposite side to said first substrate, said second semiconductor layer has a second surface parallel to said second cavity on the opposite side to said second substrate, said base is bonded onto said stem, said base, said first semiconductor laser chip and said second semiconductor laser chip are staked in that order, and said first cavity and said second cavity are aligned substantially parallel to each other, the length of said second substrate and said second cavity is greater than the length of said first substrate and said first cavity, a part of said second surface of said second semiconductor laser chip on said second one facet side is bonded to said first surface of said first semiconductor laser chip with an insulating film sandwiched therebetween, and a part of said second surface of said second semiconductor laser chip on said second other facet side projects from said first semiconductor laser chip and is not bonded to said first surface of said first semiconductor laser chip.

18. The semiconductor laser apparatus according to claim 17, wherein the length of said second cavity is greater than the length of said first cavity by not less than the amount of the thickness of said second substrate.

19. The semiconductor laser apparatus according to claim 17, wherein said second semiconductor laser chip has an electrode on a surface thereof opposite to said first semiconductor laser chip, and a wire is connected to a position of said electrode of said second semiconductor laser chip in a region above said first semiconductor laser chip.

20. The semiconductor laser apparatus according to claim 17, wherein said base has a difference in level that is formed by an upper level surface and a lower level surface, the difference in level between said lower level surface and said upper level surface is almost equivalent to the thickness of said first semiconductor laser chip, and said first semiconductor laser chip is provided on said lower level surface of said base, and a portion of said second semiconductor laser chip projecting from the region above said first semiconductor laser chip is provided on said upper level surface of said base.

* * * * *